US011530561B2

(12) United States Patent
Oldani

(10) Patent No.: US 11,530,561 B2
(45) Date of Patent: Dec. 20, 2022

(54) VARIABLE FRICTION HINGED DEVICE

(71) Applicant: Microsoft Technology Licensing, LLC, Redmond, WA (US)

(72) Inventor: Michael Gordon Oldani, Redmond, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 68 days.

(21) Appl. No.: 15/930,946

(22) Filed: May 13, 2020

(65) Prior Publication Data
US 2021/0355986 A1 Nov. 18, 2021

(51) Int. Cl.
E05D 11/08 (2006.01)
E05D 3/02 (2006.01)
F16C 11/10 (2006.01)
H05K 5/02 (2006.01)
G06F 1/16 (2006.01)

(52) U.S. Cl.
CPC .............. E05D 11/087 (2013.01); E05D 3/02 (2013.01); F16C 11/10 (2013.01); H05K 5/0226 (2013.01); E05Y 2201/218 (2013.01); E05Y 2201/26 (2013.01); E05Y 2900/606 (2013.01); G06F 1/1616 (2013.01); G06F 1/1681 (2013.01)

(58) Field of Classification Search
CPC ..... E05D 11/08; E05D 11/082; E05D 11/084; E05D 11/087; E05D 2011/085; E05D 3/02; F16C 11/10
See application file for complete search history.

(56) References Cited

U.S. PATENT DOCUMENTS

| 2,095,866 | A | * | 10/1937 | Hallenbeck | ............... | E05F 5/00 16/325 |
| 5,697,125 | A | * | 12/1997 | Gannon | ................ | E05D 11/082 16/342 |
| 5,771,539 | A | | 6/1998 | Wahlstedt et al. | | |
| 5,774,939 | A | * | 7/1998 | Lu | ......................... | G06F 1/1616 16/273 |
| 9,206,633 | B1 | * | 12/2015 | Ju | ......................... | G06F 1/1681 |
| 9,483,084 | B2 | | 11/2016 | Johnson et al. | | |
| 10,228,732 | B2 | | 3/2019 | Tomky et al. | | |
| 10,324,501 | B1 | | 6/2019 | Zimmerman et al. | | |
| 10,401,916 | B1 | | 9/2019 | Sanchez et al. | | |

(Continued)

FOREIGN PATENT DOCUMENTS

| CN | 109026980 A | 12/2018 | | |
| JP | 2001032822 A | * 2/2001 | ............ | B60J 3/0265 |

(Continued)

OTHER PUBLICATIONS

"International Search Report & Written Opinion issued in PCT Application No. PCT/US21/028045", dated Aug. 13, 2021, 13 Pages.

Primary Examiner — Emily M Morgan
(74) Attorney, Agent, or Firm — Rainier Patents, P.S.

(57) ABSTRACT

The description relates to hinged devices, such as hinged computing devices. One example can include first and second portions that rotate around a hinge shaft that is fixedly secured to the first portion and rotationally secured to the second portion. The second portion defining a first contact surface spaced apart from a second contact surface. Multiple friction clips friction fit around the hinge shaft and rotating with the hinge shaft between the first contact surface and the second contact surface.

8 Claims, 22 Drawing Sheets

(56) References Cited

U.S. PATENT DOCUMENTS

| | | | |
|---|---|---|---|
| 2002/0133908 A1* | 9/2002 | Lin | G06F 1/1616 |
| | | | 16/346 |
| 2005/0066475 A1* | 3/2005 | Minami | G06F 1/1616 |
| | | | 16/337 |
| 2006/0101616 A1* | 5/2006 | Horng | E05D 5/12 |
| | | | 16/233 |
| 2006/0272128 A1 | 12/2006 | Rude | |
| 2007/0094845 A1* | 5/2007 | Chang | G06F 1/1681 |
| | | | 16/342 |
| 2007/0101543 A1* | 5/2007 | Lu | G06F 1/1616 |
| | | | 16/342 |
| 2007/0283534 A1* | 12/2007 | Chang | G06F 1/1681 |
| | | | 16/342 |
| 2009/0293229 A1* | 12/2009 | Chiang | G06F 1/1681 |
| | | | 16/342 |
| 2009/0311073 A1* | 12/2009 | Lee | E05D 11/087 |
| | | | 411/209 |
| 2011/0232032 A1* | 9/2011 | Chu | G06F 1/1681 |
| | | | 16/221 |
| 2013/0038192 A1* | 2/2013 | Cho | E05D 11/087 |
| | | | 312/326 |
| 2015/0121654 A1* | 5/2015 | Novin | E05D 11/082 |
| | | | 16/273 |
| 2017/0218672 A1 | 8/2017 | Novin | |
| 2018/0224898 A1* | 8/2018 | Huang | G06F 1/1616 |

FOREIGN PATENT DOCUMENTS

| | | |
|---|---|---|
| JP | 2003120649 A | 4/2003 |
| KR | 200176127 Y1 | 3/2000 |
| WO | 2019179385 A1 | 9/2019 |

* cited by examiner

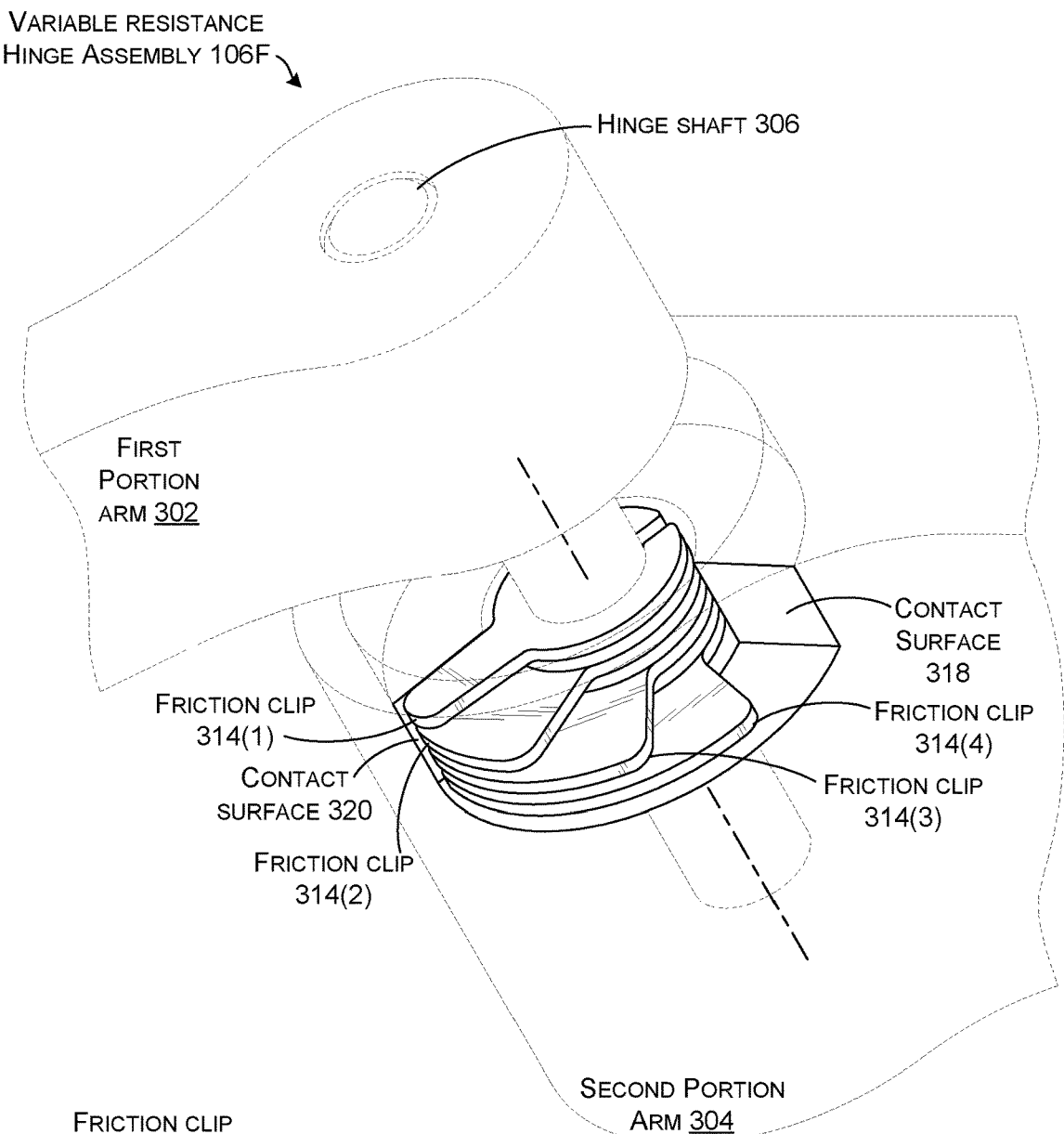
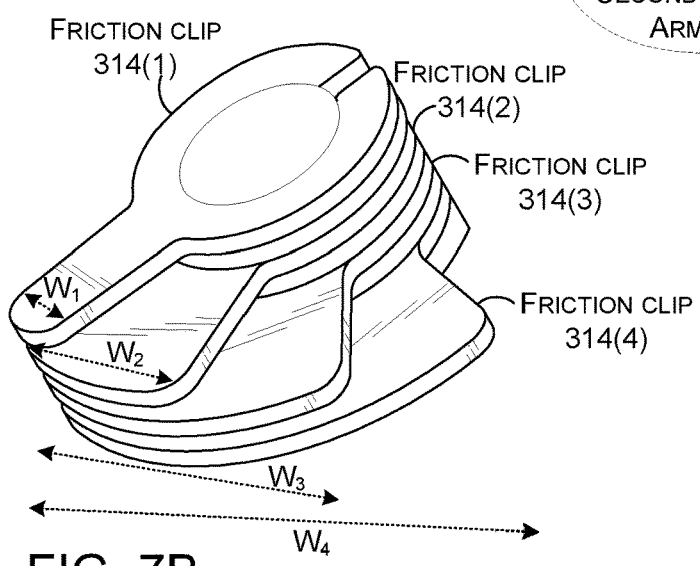
FIG. 7A
FIG. 7B

VARIABLE FRICTION HINGED DEVICE

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced. Where space permits, elements and their associated reference numbers are both shown on the drawing page for the reader's convenience. Otherwise, only the reference numbers are shown.

FIGS. 1A-1E, 2A, 2B, 3A, 3B, 4A-4G, 5A-5D, 6A, 6B, and 7A-7D show perspective views of example devices in accordance with some implementations of the present concepts.

DESCRIPTION

Figure 1A:
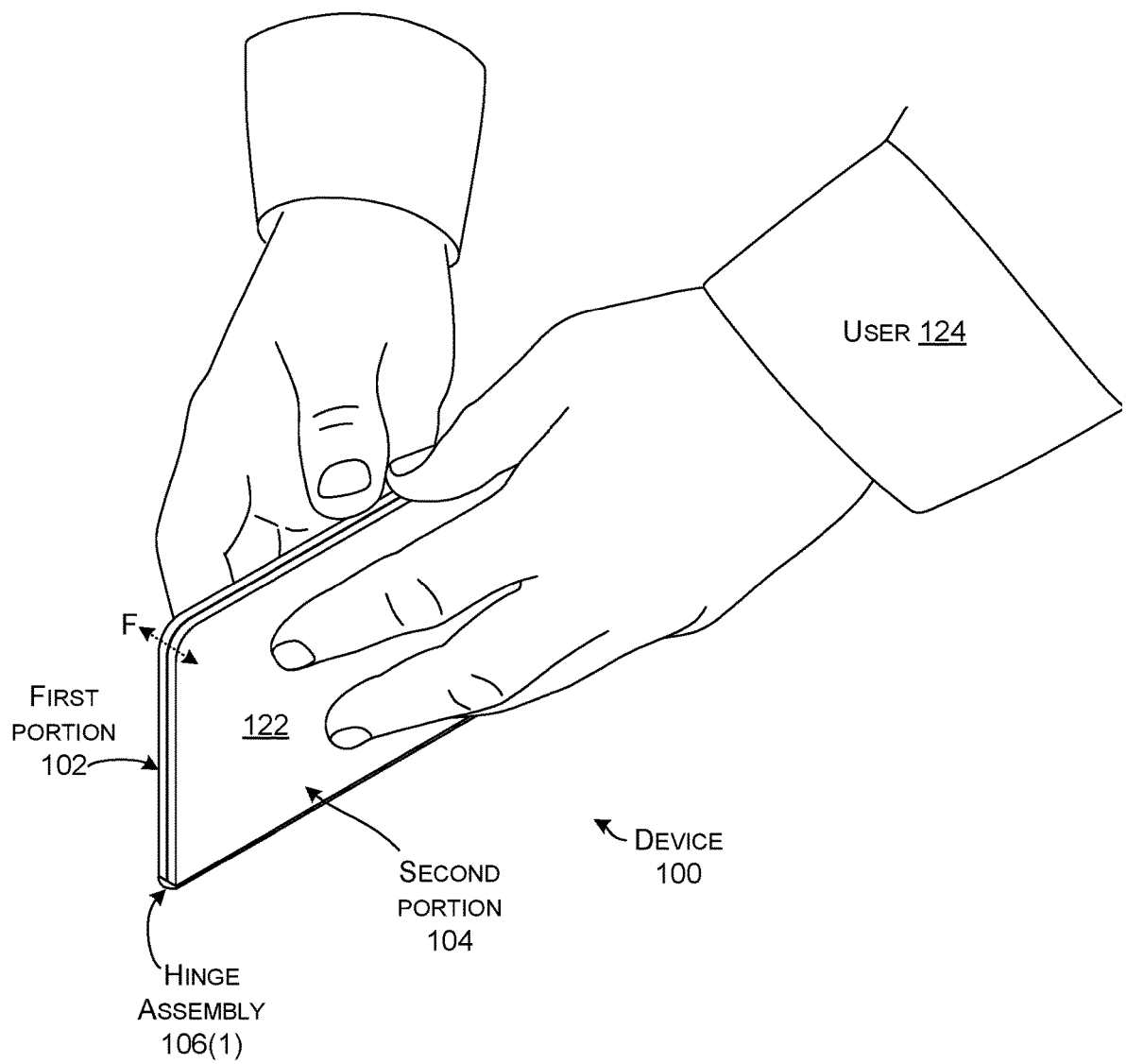

The present concepts relate to devices, such as computing devices employing variable resistance hinge assemblies that can rotationally secure first and second device portions relative to a hinge axis. The variable resistance hinge assemblies can define a range of orientations that the first and second portions can rotate through. For example, the range of orientations can be bounded by a closed orientation of zero degrees and an open orientation, such as 150 degrees. The variable resistance hinge assembly can provide increasing resistance as rotation continues in a given direction, such as from closed to open. When rotation switches direction, the variable resistance hinge can provide a lesser resistance that once again increases as rotation continues. In this way, the hinge may have high resistance when the device is fully opened (e.g., to keep the device from inadvertently closing) and when the device is fully closed (e.g., to keep the device from inadvertently opening) with low resistance when the device is partially open (e.g., to increase user accessibility by requiring less force to move the device between the open and closed orientations). These and other aspects are described below.

Introductory FIGS. 1A-1E collectively show an example device 100 that has first and second portions 102 and 104 that are rotatably secured together by variable resistance hinge assemblies 106. In the illustrated implementation, two variable resistance hinge assemblies 106(1) and 106(2) are employed (e.g., one near each end (outer edges) of the device), but other implementations could employ a single variable resistance hinge assembly or more than two variable resistance hinge assemblies. In the illustrated configuration, the variable resistance hinge assemblies 106 define a center of the device from which the first and second portions extend.

The first portion 102 can extend from a hinge end 108 to a distal end 110. The second portion 104 also can extend from a hinge end 112 to a distal end 114. The first portion 102 can include first and second surfaces 116 and 118 and the second portion 104 can include first and second surfaces 120 and 122.

The variable resistance hinge assemblies 106 can define the hinge axis (HA) around which the first and second portions 102 and 104 rotate. The variable resistance hinge assemblies 106 can also provide resistance to rotation around the hinge axis. The resistance to rotation can contribute to the first and second portions maintaining a specific orientation unless acted upon by a force, such as supplied by the user wanting to rotate the device portions to another orientation.

Figure 1B:
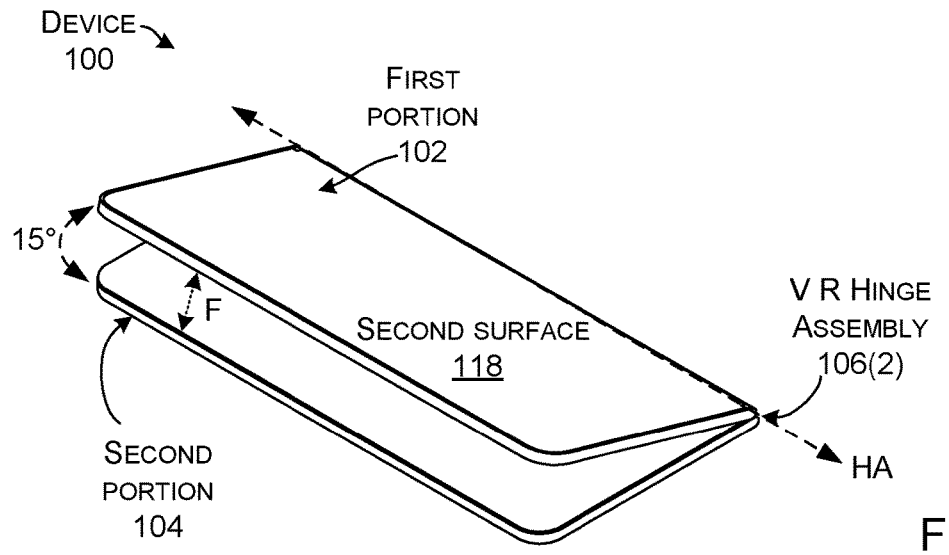
Figure 1C:
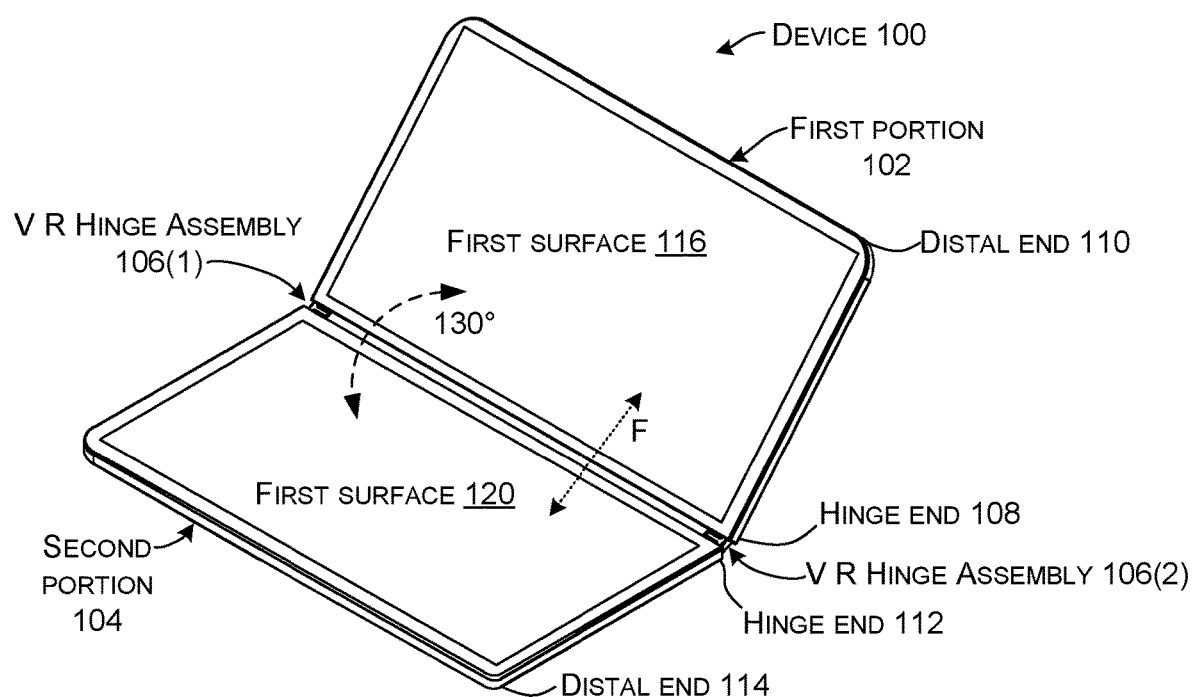

FIG. 1A shows the device 100 in a closed orientation with the first surfaces 116 and 120 of the first and second portions 102 and 104 positioned against one another. The variable resistance hinge assemblies 106 can provide a relatively low amount of resistance to rotation in an opening direction. FIG. 1A also shows a user 124 applying a small force (e.g., arrow F) to open the first and second portions 102 and 104. FIG. 1B shows the first and second portions rotated to about a 15-degree orientation where the variable resistance hinge assemblies can provide slightly more resistance to further rotation in the opening direction. To overcome the additional resistance, the force F imparted by the user is larger to keep opening the device. FIG. 1C shows the first and second portions further rotated to about a 130-degree orientation, which in this implementation is approaching a fully open orientation. At this point, the variable resistance hinge assemblies 106 can provide greater resistance to further opening rotation so that the device maintains this orientation (e.g., does not continue to rotate in the opening direction) unless the user applies additional force. However, the variable resistance hinge assemblies can offer less resistance to rotation in the opposite direction (e.g., in the closing direction).

Figure 1D:
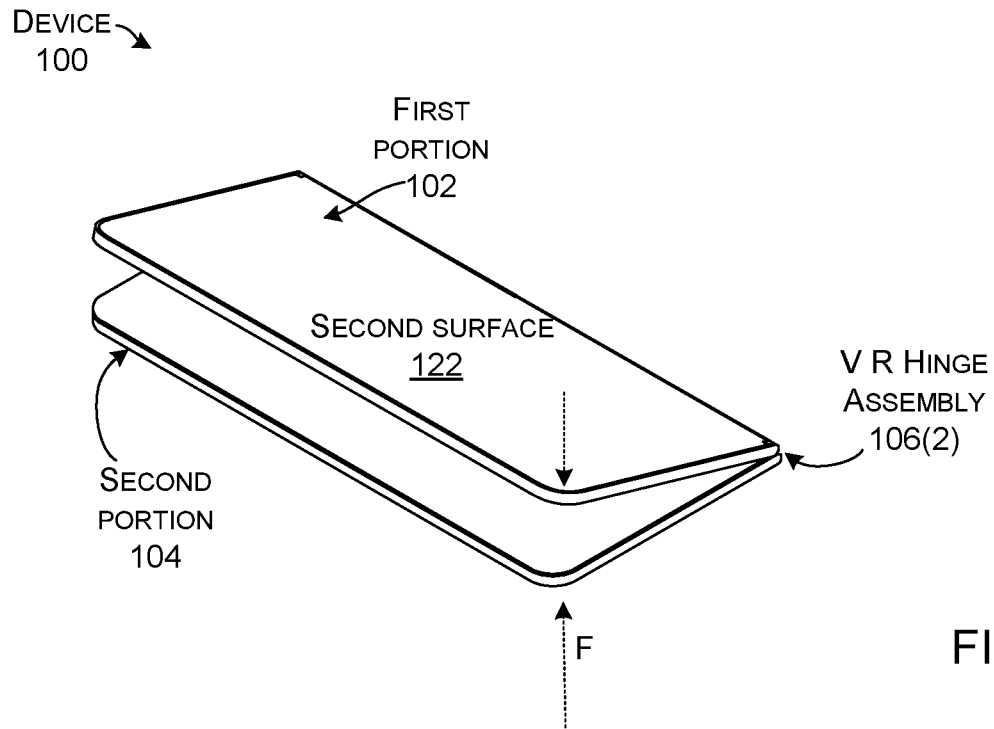
Figure 1E:
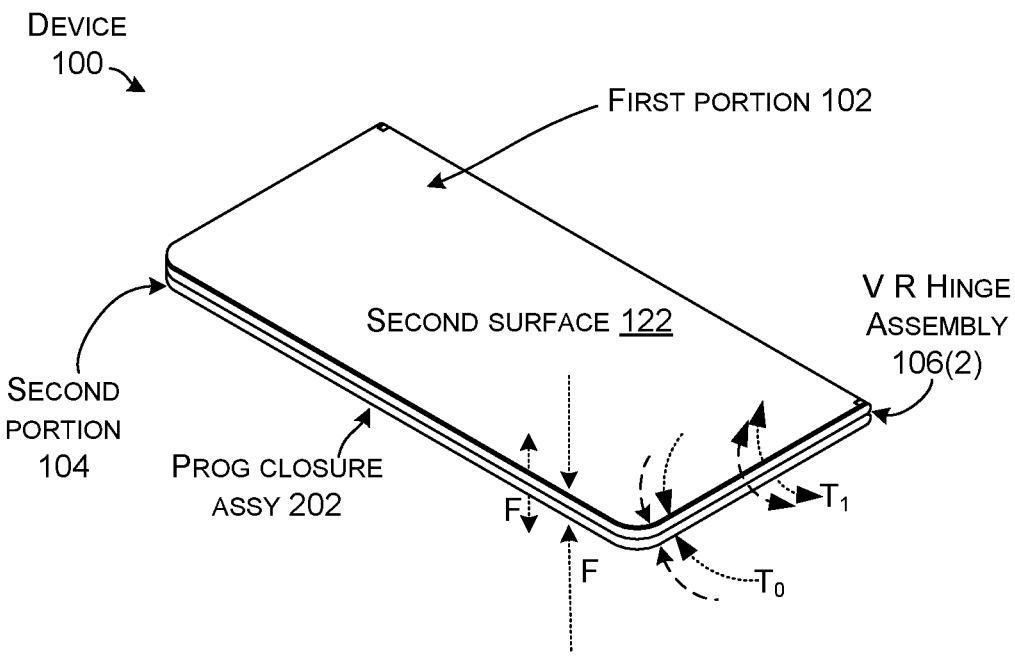

FIG. 1D shows the first and second portions 102 and 104 rotated in the opposite (e.g., closing) direction from the orientation of FIG. 1C. At this point, the variable resistance hinge assemblies 106 provide greater resistance to further rotation in the closing direction than they did in the open orientation of FIG. 1C. FIG. 1E shows the first and second portions rotated all the way back to the closed orientation. At this point, the variable resistance hinge assemblies provide relatively large resistance to further rotation in the closing direction while providing relatively low resistance to rotation in the opening direction as discussed relative to FIG. 1A.

Stated another way, the resistance to rotation provided by the variable resistance hinge assemblies 106 is increasing as the closing rotation progresses from the open orientation of FIG. 1C toward the closed orientation of FIG. 1E. Thus, torque $T_O$ that the user must input to overcome this resistance to rotation is increasing. Conversely, the resistance to rotation in the opposite direction (e.g., in the opening direction) is decreasing and thus the torque $T_1$ the user must input to overcome the resistance to rotation to open is decreasing. Thus, the user will have a pleasant experience of being able to easily reopen the device, such as with one hand. Yet, as the device orientation progresses toward the fully open orientation, the increasing resistance can ensure that the device maintains the orientation that the user desires.

Figure 2A:
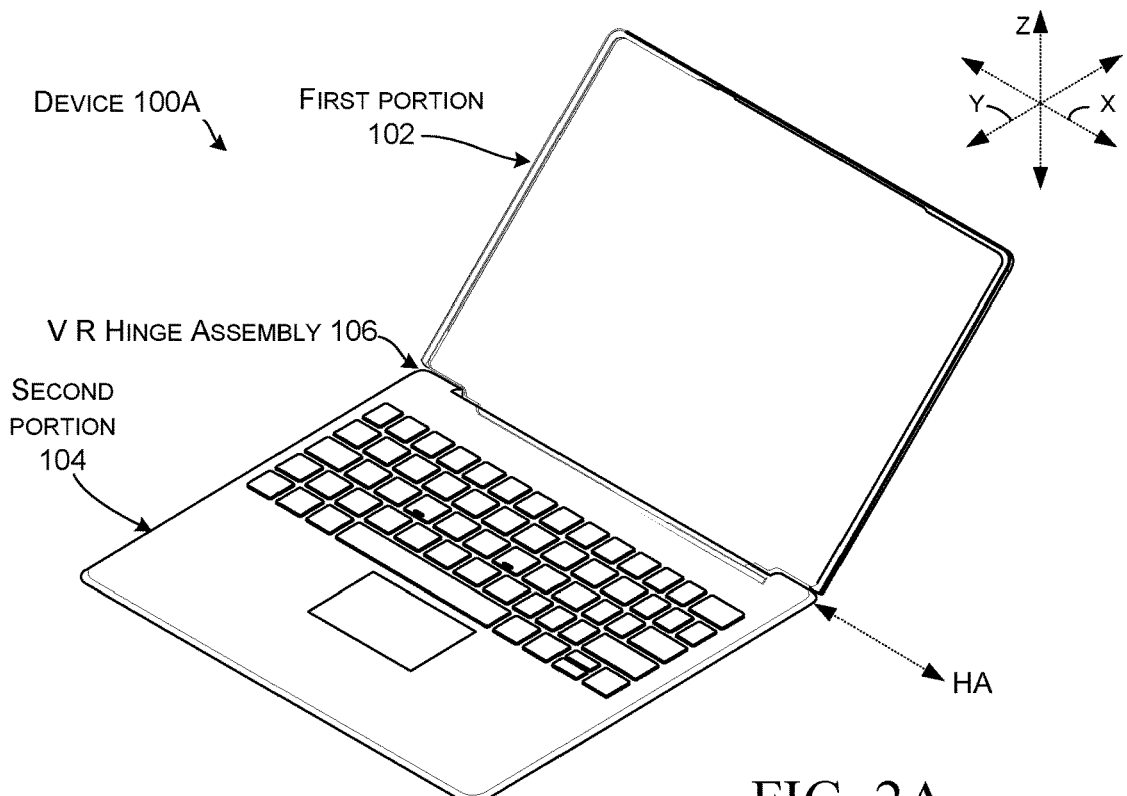
Figure 2B:
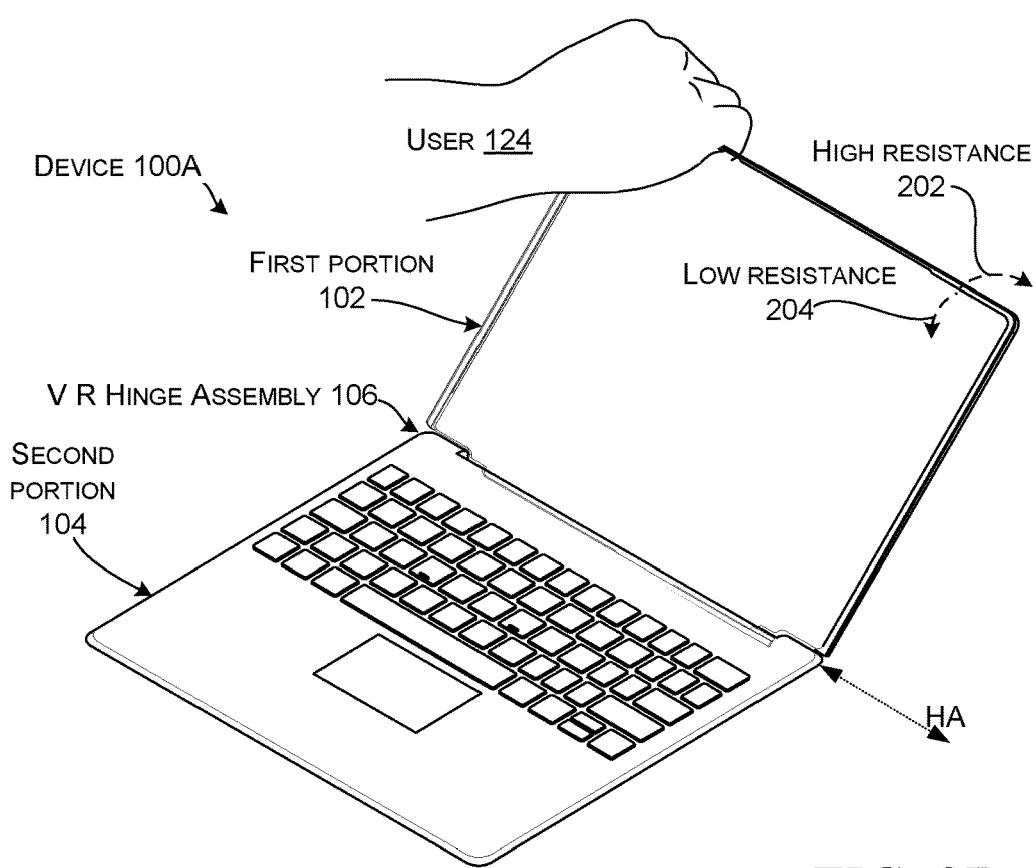

FIGS. 2A and 2B show another example device 100A that can include variable resistance hinge assembly(s) 106. In this case the first and second portions 102 and 104 are orientated close to a fully open orientation of the device. For example, the first and second portions can be oriented at approximately 130 degrees and the fully open orientation can be 150 degrees. At this point, the variable resistance hinge assembly 106 can provide relatively high resistance at 202 to further opening rotation around the hinge axis. This relatively high resistance to rotation can ensure that the device maintains this orientation and does not 'fall' further open. In contrast, if the user is done working on the device and want to close it, the variable resistance hinge assembly offers relatively low resistance at 204 to rotation in the closing direction.

FIGS. 1A-1E and 2A-2B provide two form factors that can implement the present concepts. Other form factors are contemplated, such as various other computing devices, wearable devices, vehicles, etc. The discussion below introduces example component configurations for achieving the functionality described above, among other functionalities.

Figure 3A:
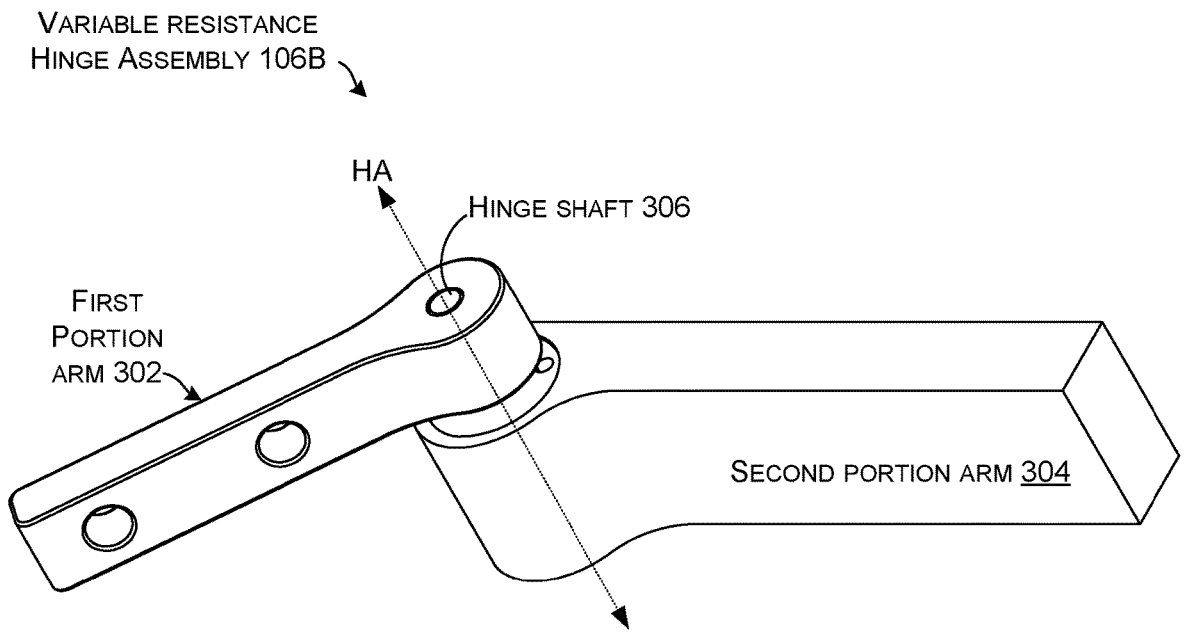
Figure 3B:
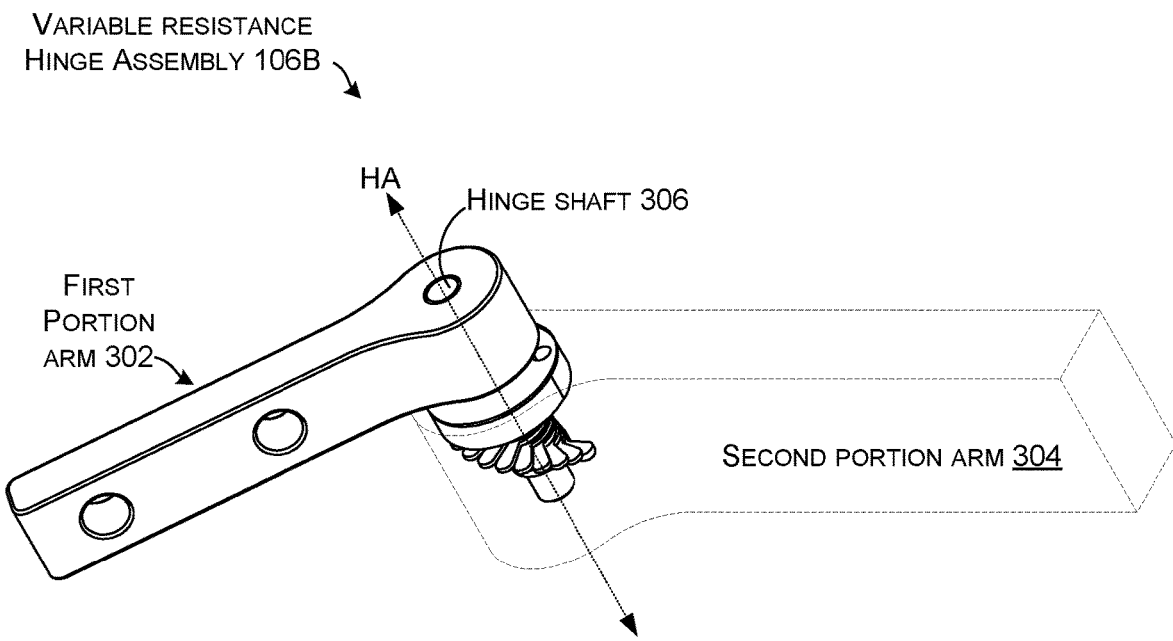
Figures 3C, 3D:
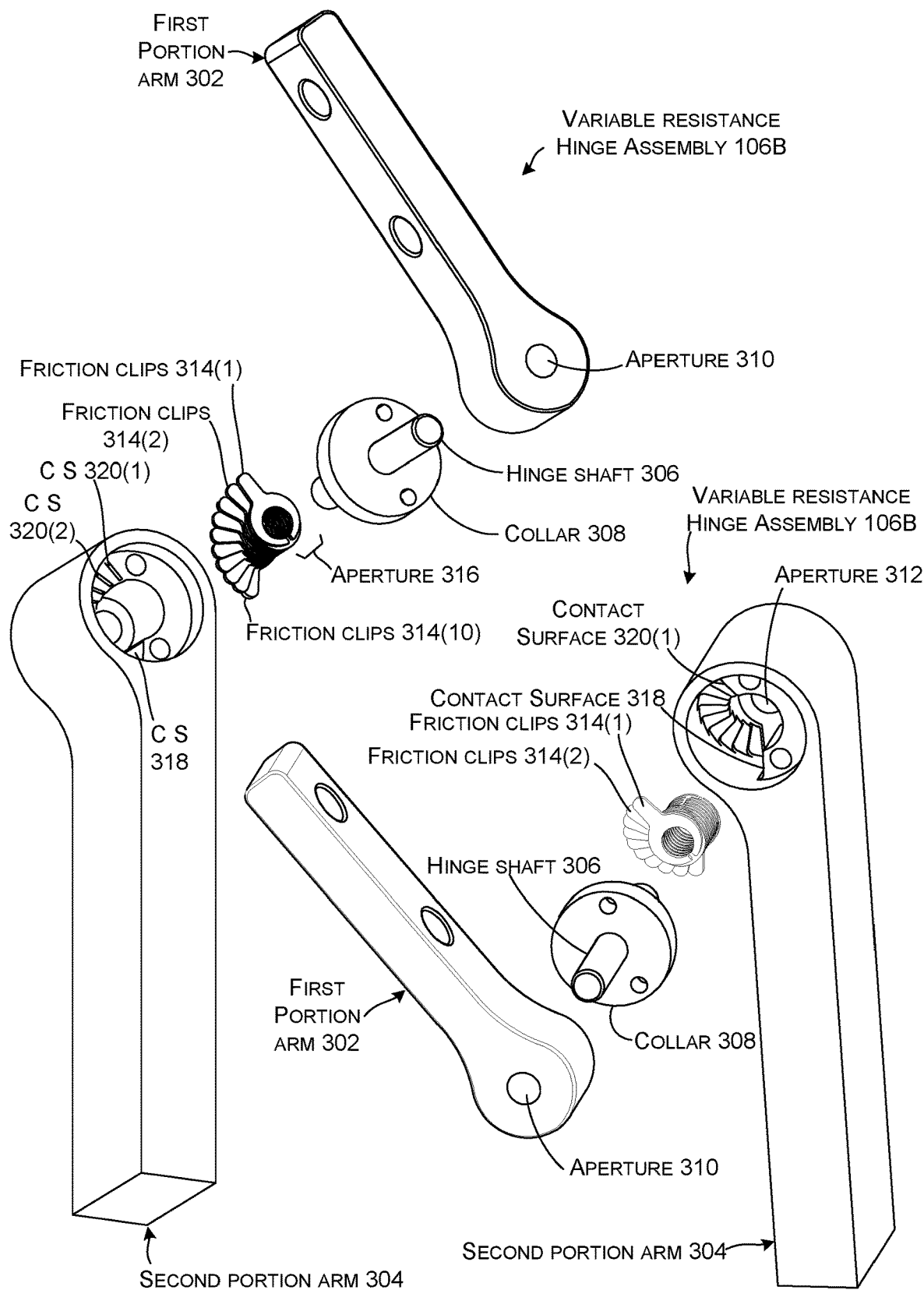
FIGS. 3C and 3D show exploded perspective views of example devices in accordance with some implementations of the present concepts.
Figure 3E:
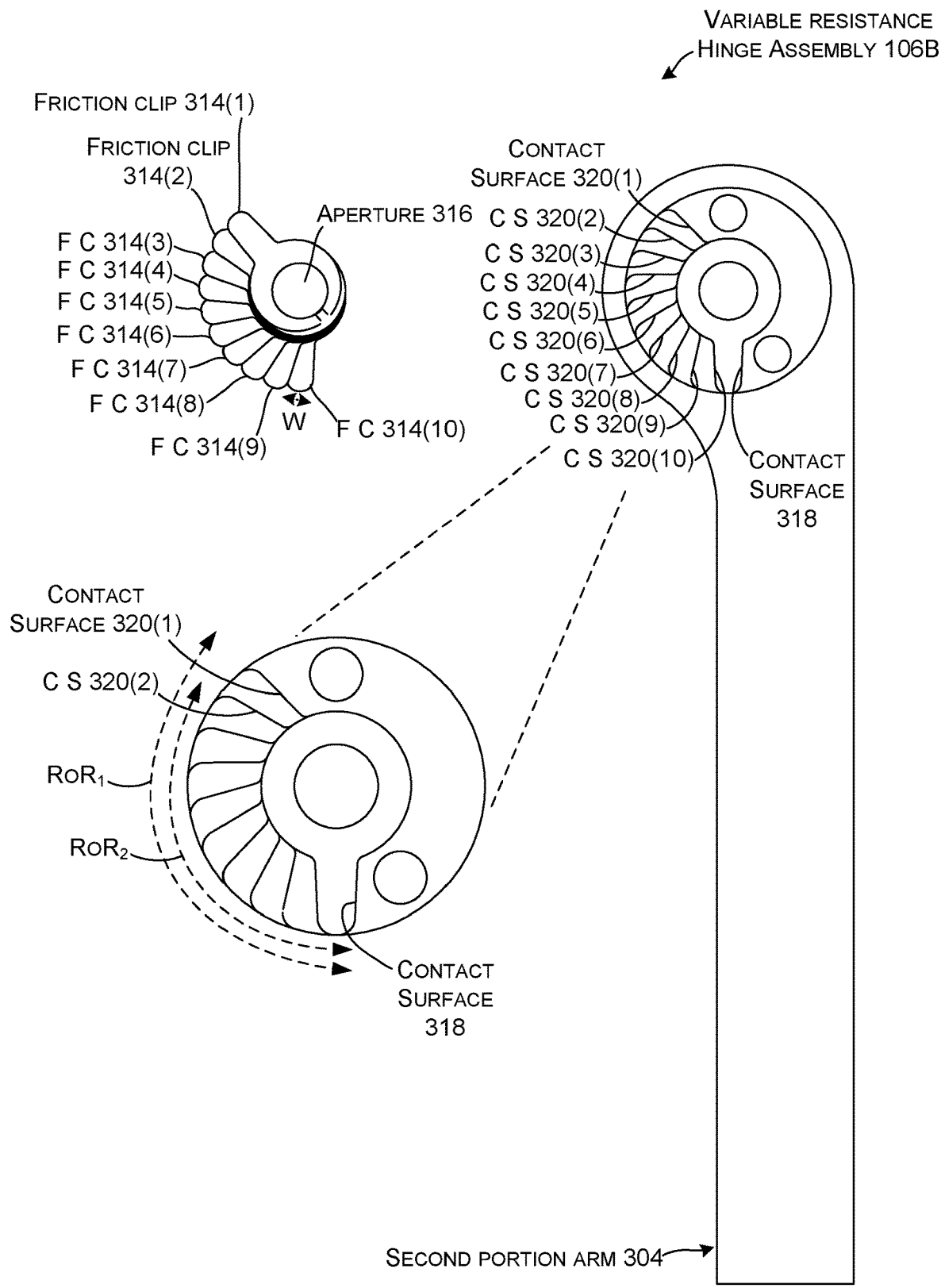
FIG. 3E shows an elevational view of an example device in accordance with some implementations of the present concepts.

FIGS. 3A-3E collectively illustrate an example variable resistance hinge assembly 106B. FIG. 3A shows a perspective view of the variable resistance hinge assembly 106B. FIG. 3B shows a similar view, but with some components shown in ghost so that underlying components can be visualized. FIGS. 3C and 3D are exploded perspective views. FIG. 3E is an elevational view of some components.

In this case, variable resistance hinge assembly 106B includes first portion arm 302, second portion arm 304, hinge shaft 306, collar 308, aperture 310, aperture 312, friction clips 314, spacers 315, aperture 316, contact surface 318, and contact surface 320. In this example, ten friction clips 314 are utilized, but the use of any plural number of friction clips is contemplated. Also, in this implementation all of the friction clips have the same width W, but other configurations are contemplated. One such implementation is described below relative to FIGS. 7A-7D.

The first portion arm 302 can facilitate securing the variable resistance hinge assembly 106B to the first portion (102, FIG. 1A). Similarly, the second portion arm 304 can facilitate securing the variable resistance hinge assembly 106B to the second portion (104, FIG. 1A). The hinge shaft 306 can extend along the hinge axis. The collar 308 can be positioned on the hinge shaft 306 and can secure the hinge shaft to the first and second portion arms 302 and 304, such as with fasteners (not shown) through aligned holes in the collar 308 and the first and second portions (shown, but not specifically designated). In this configuration, the hinge shaft 306 can be secured in a fixed (e.g., non-rotational relationship) to the first portion arm 302 and rotationally secured to the second portion arm 304.

The friction clips 314 can be positioned sequentially on the hinge shaft 306 in alternating fashion with the spacers 315. Other implementation may omit the spacers. In this case, the friction clips 314 are friction fit onto the hinge shaft 306. The friction fit can be achieved by the aperture 316 of the friction clips 314 being slightly smaller than an outside diameter of the hinge shaft 306, among other techniques.

A free range of rotation (RoR) of the friction clips 314 can be defined at least in part by a width of the friction clip and/or the distance (in degrees of rotation) between the first contact surface 318 and the second contact surface 320. (See FIG. 3E). Note that the free range of rotation can be different (e.g., unique) for different friction clips 314. For instance, the free range of rotation ($RoR_1$) of friction clip 314(1) is defined by the distance between contact surface 318 and contact surface 320(1). The free range of rotation ($RoR_2$) of friction clip 314(2) is defined by the distance between contact surface 318 and contact surface 320(2). Thus, in this configuration, friction clip 314(1) has the greatest free range of rotation and the free range of rotations get progressively smaller with friction clip 314(10) having the smallest free range of rotation.

Given the friction fit of the friction clips 314 on the hinge shaft 306, the friction clips will rotate with the hinge shaft within their free range of rotation. When the friction clip reaches either end of the free range of rotation, e.g. contacts either contact surface 318 or contact surface 320, further rotation of the hinge shaft 306 will cause slippage between the friction clip 314 and the hinge shaft 306 (e.g., the hinge shafts rotates within the aperture of the friction clip). The friction associated with this slippage produces at least a portion of the resistance to rotation introduced above. Recall that there are multiple independent friction clips that encounter different free ranges or rotation. The collection of friction clips can provide the variable resistance to rotation introduced above. These aspects are discussed in more detail below relative to FIGS. 4A-4G.

FIGS. 4A-4G collectively illustrate how the hinge shaft 306, friction clips 314, and contact surfaces 318 and 320 can cooperatively provide the variable resistance to rotation of the first and second portions relative to the hinge shaft. These components are illustrated on another example variable resistance hinge assembly 106C that is similar to variable resistance hinge assembly 106B. For ease of explanation, only four friction clips 314 are illustrated.

Figure 4A:
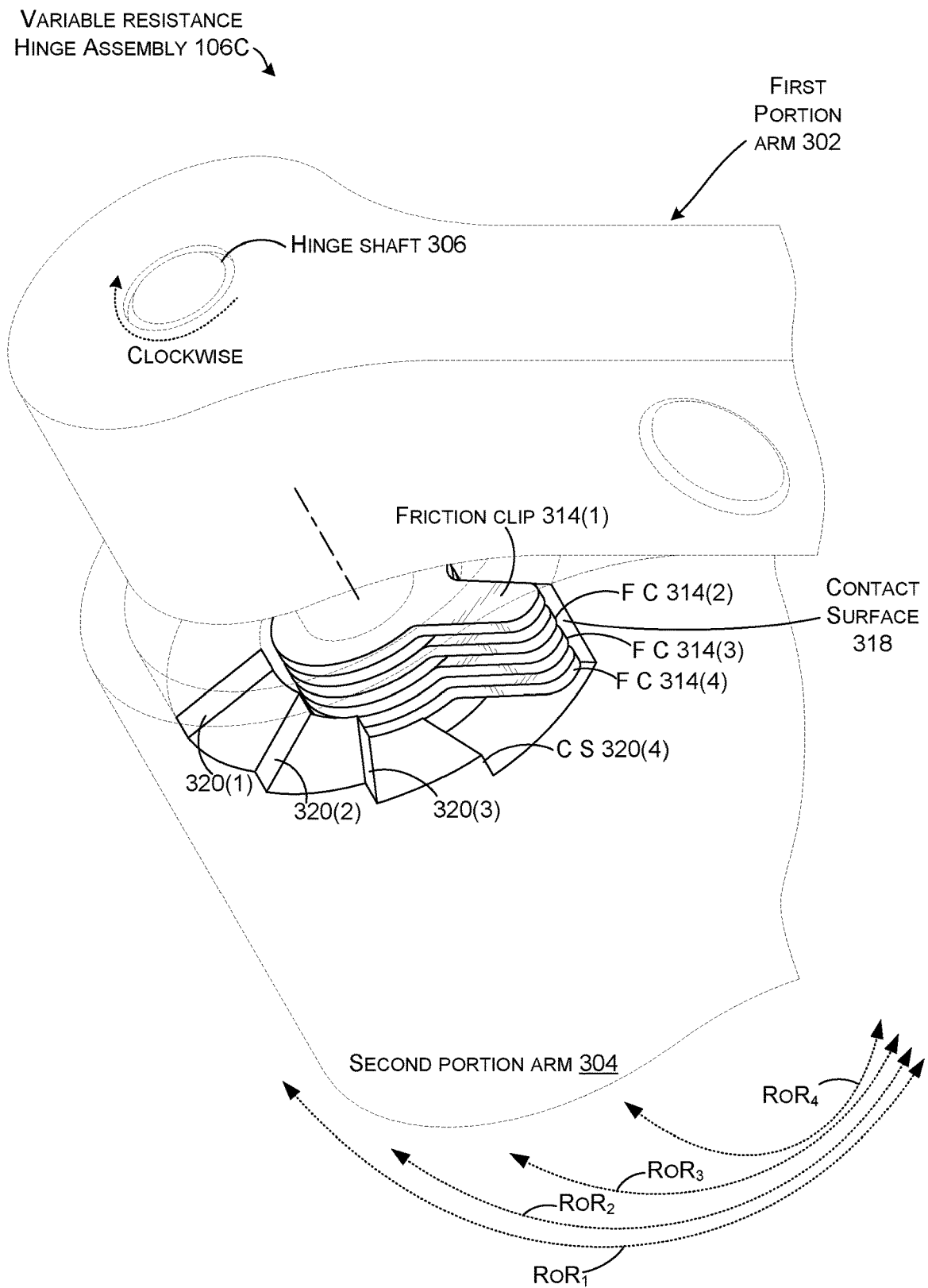

FIG. 4A shows the variable resistance hinge assembly 106C in a closed or zero-degree orientation. At this point, the friction clips 314 are all positioned against contact surface 318. Individual friction clips also have a corresponding individual (portion) of contact surface 320. For instance, the free angle of rotation ($RoR_1$) for friction clip 314(1) is defined between contact surface 318 and contact surface 320(1). For purposes of explanation, assume that the user wants to open the device (indicated as clockwise rotation of the first portion arm 302 relative to the second portion arm 304). At this point, all of the friction clips 314 are free to rotate in the clockwise direction (e.g., not blocked by contact surface 320) so the friction clips do not provide any resistance to rotation in the clockwise direction.

Figure 4B:
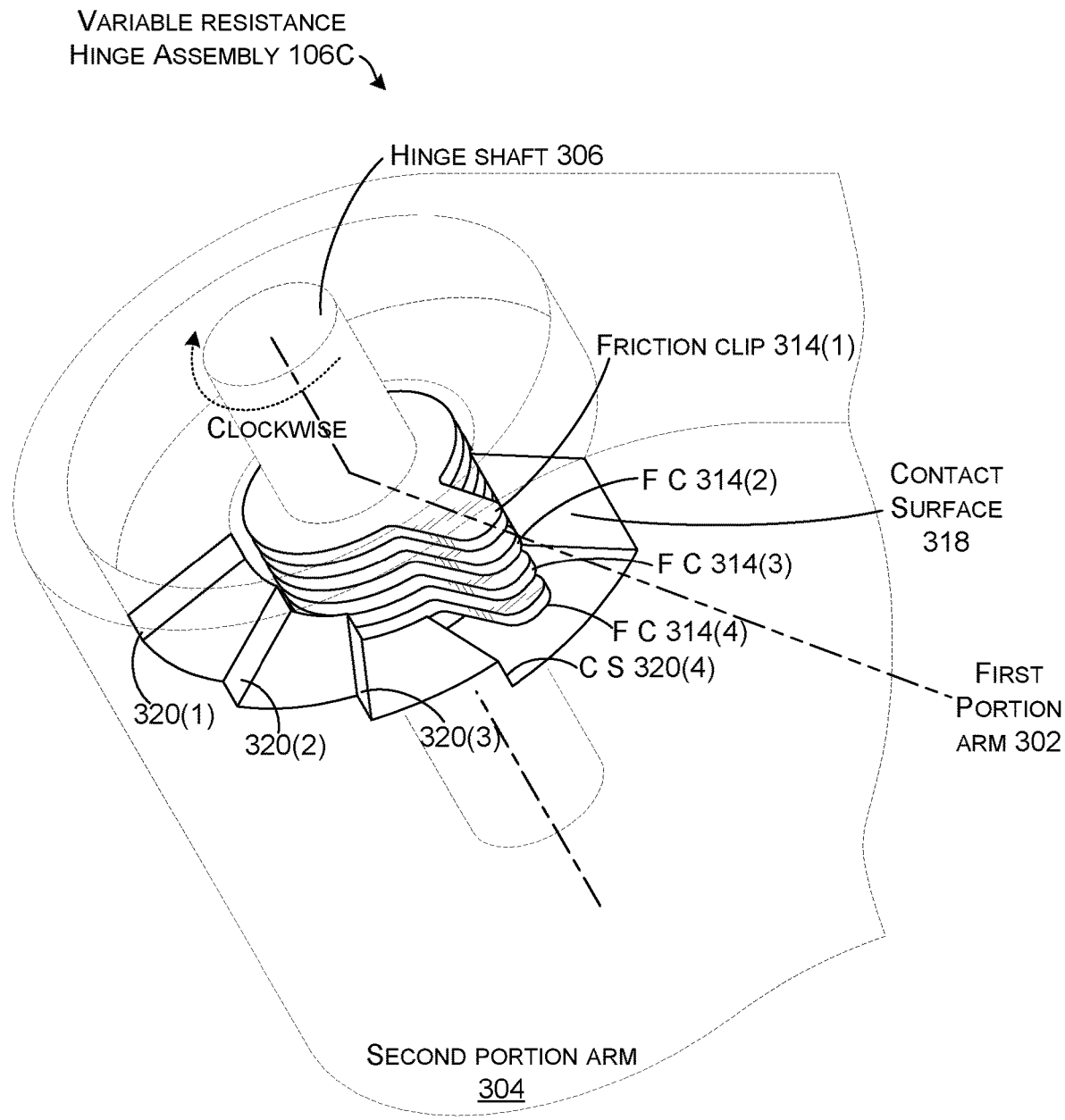

FIG. 4B shows the variable resistance hinge assembly 106C after about 15 degrees of rotation in the clockwise direction relative to FIG. 4A. At this point, none of the friction clips 314 have encountered contact surfaces 320. As such, the friction clips are free to rotate with the hinge shaft 306. (Note that in FIG. 4B and in some of the subsequent FIGS., first portion arm 302 is represented by a single dashed line to reduce clutter on the drawing page).

Figure 4C:
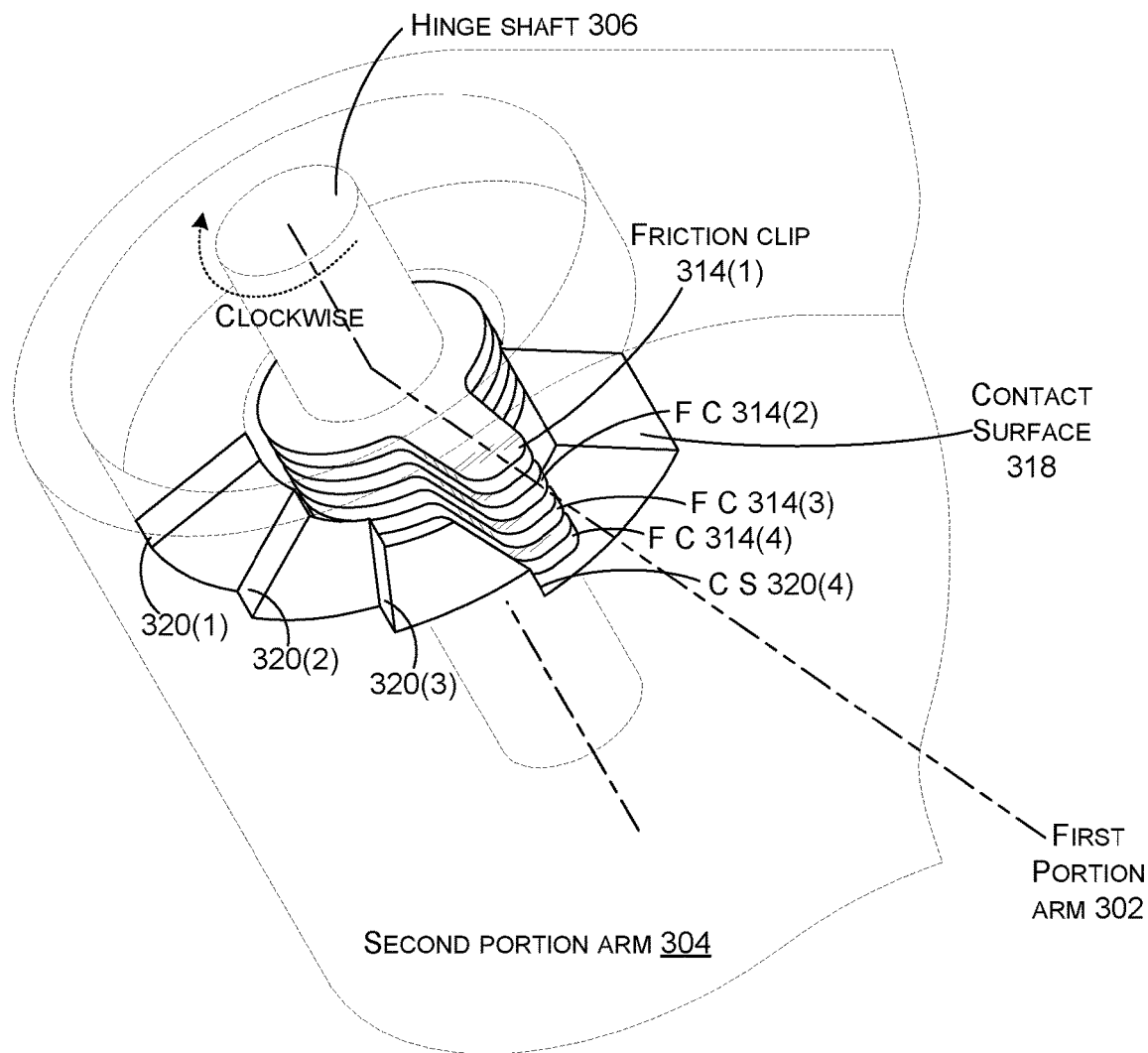

FIG. 4C shows the variable resistance hinge assembly 106C after about 15 more degrees of rotation in the clockwise direction relative to FIG. 4B. At this point, friction clip 314(4) has just encountered contact surfaces 320(4). As such, the friction clip 314(4) is blocked from further rotation. In order for the hinge shaft 306 to continue to rotate, the hinge shaft will have to spin within friction clip 314(4). The friction associated with such spinning creates resistance to rotation. At this point, friction clips 314(1)-314(3) remain free to continue to rotate.

Figure 4D:
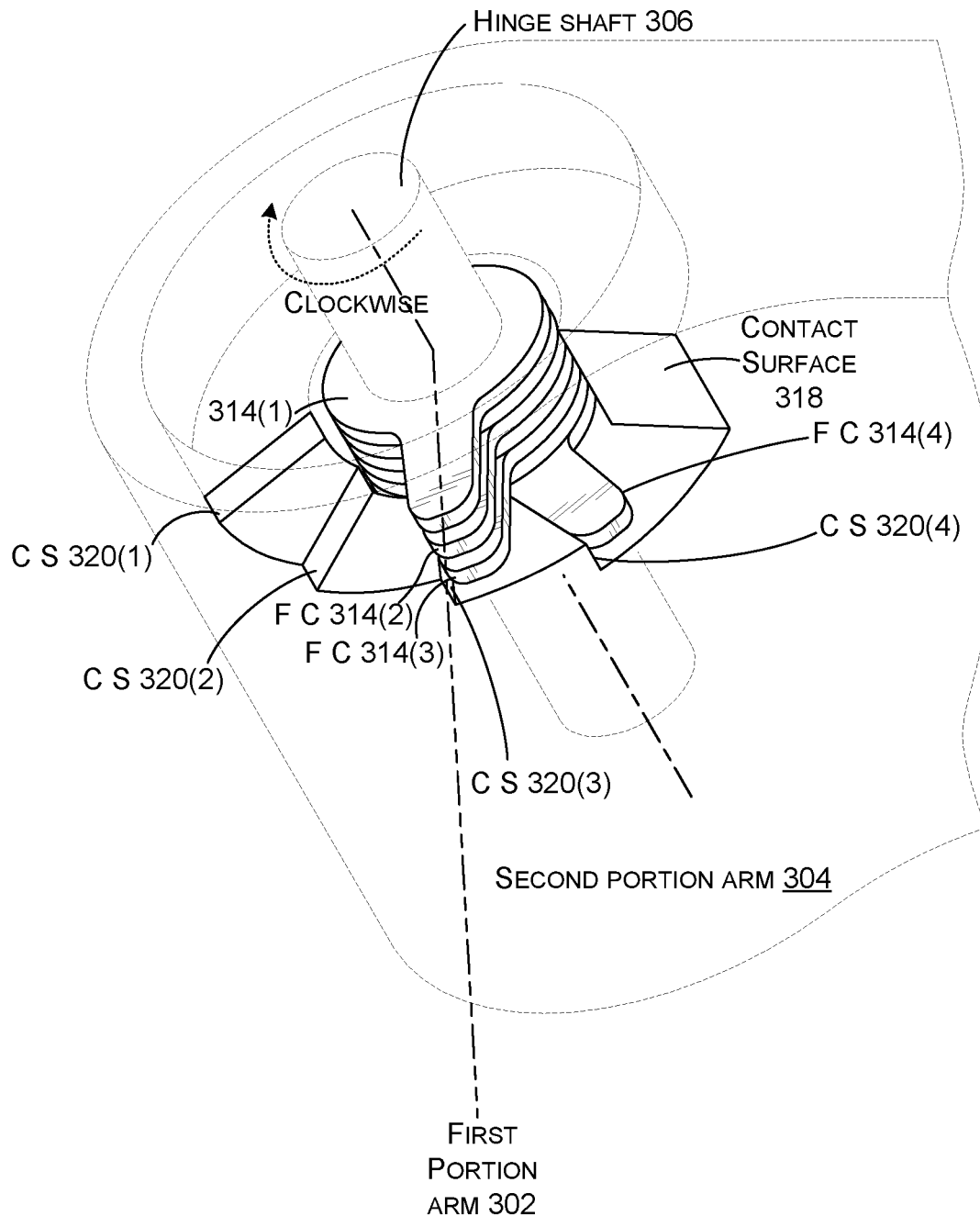

FIG. 4D shows the variable resistance hinge assembly 106C after about another 30 degrees of rotation in the clockwise direction relative to FIG. 4C. At this point, friction clip 314(3) has just encountered contact surfaces 320(3). As such, the friction clip 314(3), as well as friction clip 314(4), is now blocked from further rotation. In order for the hinge shaft 306 to continue to rotate, the hinge shaft 306 will have to spin within friction clips 314(3) and 314(4). The friction associated with such spinning creates resistance to rotation. At this point, friction clips 314(1) and 314(2) remain free to continue to rotate.

Figure 4E:
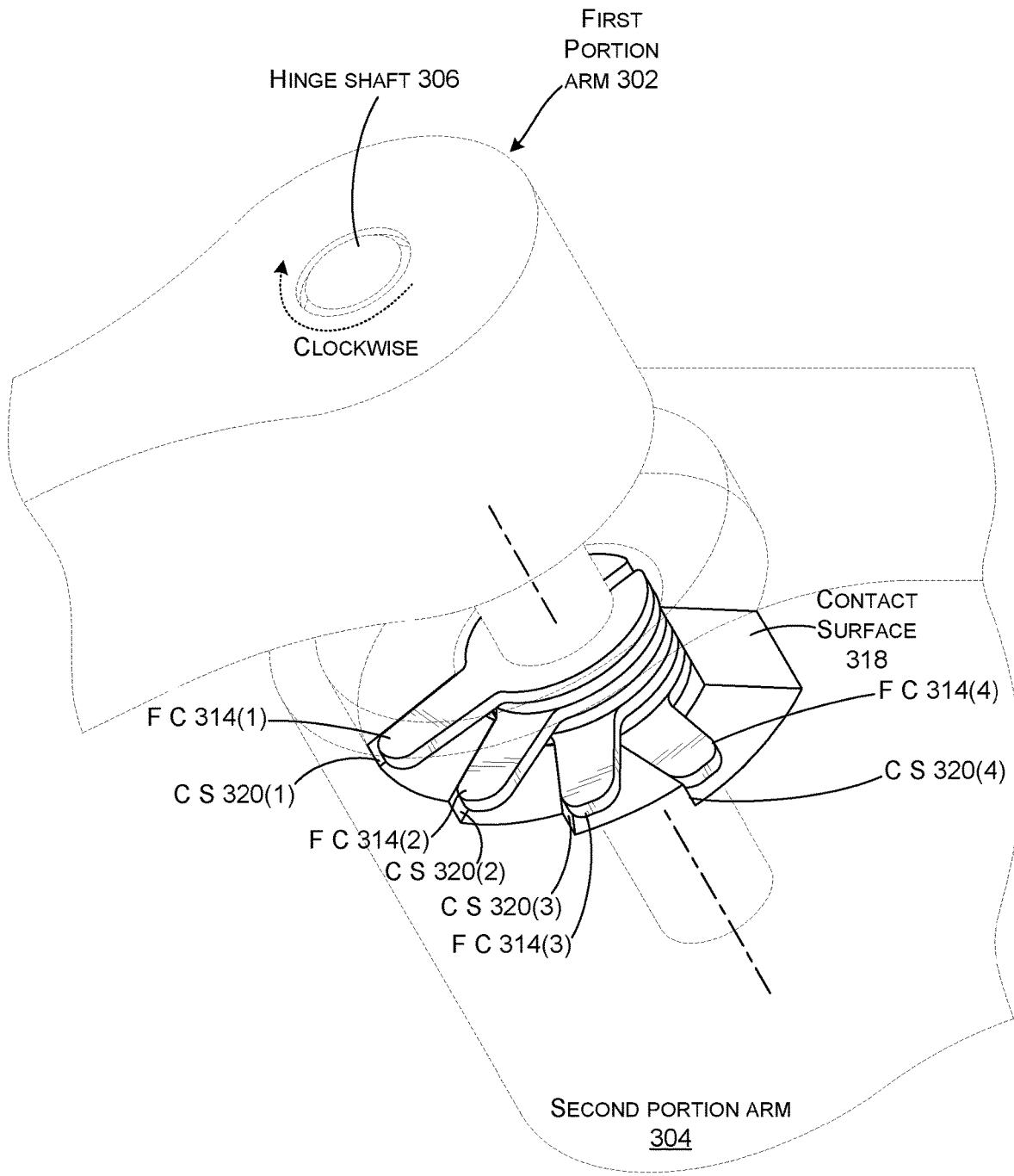

FIG. 4E shows the variable resistance hinge assembly 106C after about another 60 degrees of rotation in the clockwise direction relative to FIG. 4D. At this point, friction clip 314(1) has just encountered contact surface 320(1). As such, the friction clip 314(1) as well as friction clips 314(2)-314(4) are now blocked from further rotation. In order for the hinge shaft 306 to continue to rotate, the hinge shaft will have to spin within friction clips 314(1)-314(4). The friction associated with such spinning (both static friction and kinetic friction) creates resistance to rotation.

In reviewing FIGS. 4A-4E, the sequence begins at FIG. 4A with all friction clips 314 free to rotate with the hinge shaft 306 in the clockwise direction so the friction clips do not provide resistance to rotation. FIG. 4C shows one friction clip blocked from further rotation, so resistance to further rotation is created. FIG. 4D shows two friction clips blocked from further rotation so the resistance to further hinge shaft rotation increases. FIG. 4E shows all four friction clips blocked from further rotation so the resistance to further clockwise rotation is maximized (four of four friction clips contributing). As mentioned above relative to FIGS. 1A-1E this feature can, for instance, help the variable resistance hinge assembly maintain the device orientation. For instance, FIG. 4E can represent a fully open device orientation, such as 120-150 degrees for a notebook computer. The variable resistance hinge assembly can provide the resistance to rotation so the device holds this open orientation. Note however, that the resistance can be unidirectional (e.g., the friction clips are blocked from further clockwise rotation, but not from counter-clockwise (CCW) rotation. Assume for purposes of explanation that the user now wants to close the device, which will rotate the hinge shaft in the opposite or counter-clockwise direction.

Figure 4F:
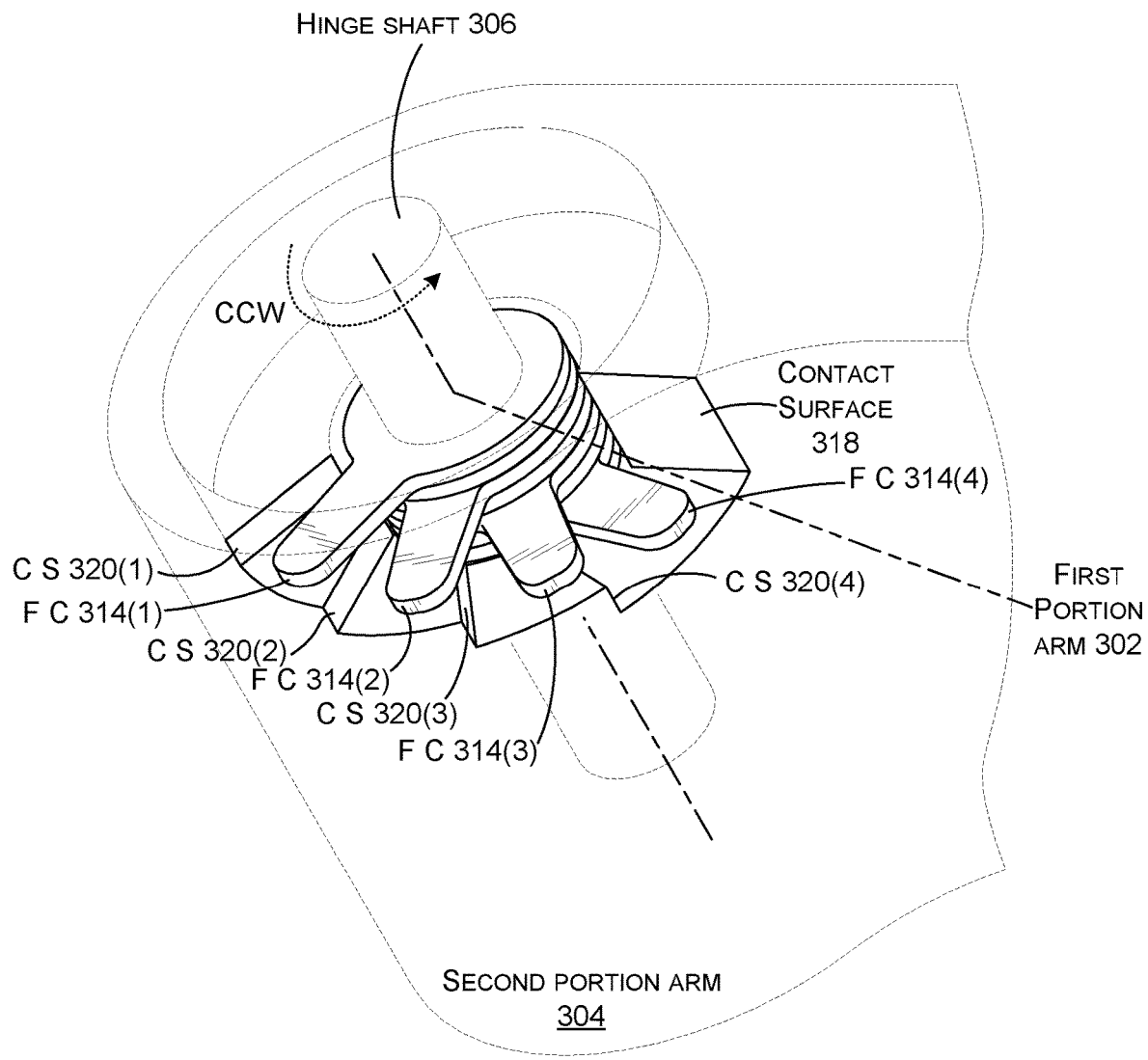

FIG. 4F shows the hinge shaft 306 and the friction clips 314 rotated about 10 degrees counter-clockwise relative to FIG. 4E. Note that at this point none of the friction clips 314 are blocked from rotation in the counter-clockwise direction and thus do not contribute to resistance of rotation of the hinge shaft 306.

Figure 4G:
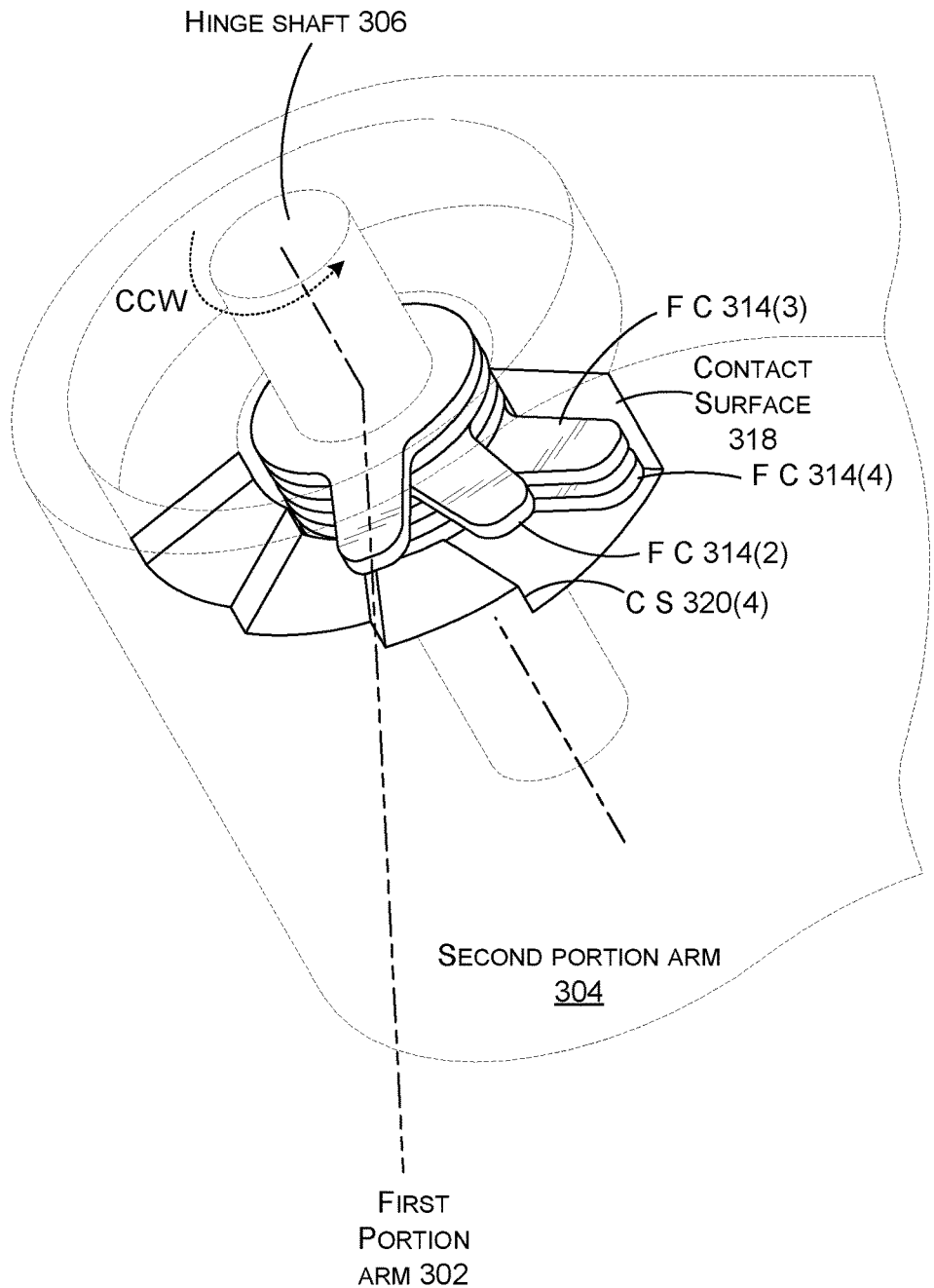

FIG. 4G shows the hinge shaft 306 and the friction clips 314 rotated about another 50 degrees counter-clockwise relative to FIG. 4F. At this point friction clips 314(3) and 314(4) are blocked from further rotation in the counter-clockwise direction by contact surfaces 318 and thus are providing resistance to further counter-clockwise rotation. Friction clips 314(1) and 314(2) are in their mid-ranges of their free range of rotation (e.g., are not in contact with either contact surface) and thus do not contribute to resistance to rotation of the hinge shaft 306. Thus, at this point the resistance to rotation in the counter-clockwise direction is at about 50% of its highest value (e.g., friction clips 314(3) and 314(4) are providing resistance to rotation but friction clips 314(1) and 314(2) are not). Another approximately 30 degrees of rotation will cause friction clip 314(2) to encounter contact surface 318 and thus increase the resistance to rotation to about 75%. Finally, a further 30 degrees of rotation will cause friction clip 314(1) to be stopped by contact surface 318. At that point, the orientation resembles the closed orientation of FIG. 4A where the variable resistance hinge assembly is providing its highest resistance to further rotation in the counter-clockwise direction, but no resistance to rotation in the clockwise direction.

Note that in the illustrated configuration of FIGS. 4A-4G, the contact surfaces 320 are evenly distributed away from the opposite contact surface 318. For instance, in a configuration with a desired open configuration of about 140-160 degrees between the first and second portions, contact surface 320(4) can be at 35 degrees from contact surface 318, contact surface 320(3) can be at 70 degrees from contact surface 318, 320(2) can be at 105 degrees from contact surface 318, contact surface 320(1) can be at 140 degrees from contact surface 318. Thus, resistance to rotation goes up by about 25% for each 25% of rotation. However, an alternative configuration could have the contact surfaces 320 concentrated at one portion of the overall range of rotation of the first and second portions. For instance, relative to the 140 degree fully open implementation, the contact surfaces 320 could be positioned at 110 degrees, 120 degrees, 130 degrees, and 140 degrees, for example. This configuration would provide little or no resistance to rotation through the first 110 degrees of rotation and then the resistance to rotation would quickly go up through the last 30 degrees of rotation. Further, while even distribution is used in these examples. Other implementations could use dissimilar values to achieve a desired resistance to rotation (e.g., torque) profile. For instance, the contact surfaces 320 could be positioned at 100 degrees, 120 degrees, 135 degrees, and 140 degrees, for example.

FIGS. 5A-5D collectively show another example variable resistance hinge assembly 106D that is similar to the variable resistance hinge assembly 106C of FIGS. 4A-4G and as such not all elements are reintroduced for sake of brevity. Of note, variable resistance hinge assembly 106D includes an additional friction clip 314(5) and contact surface 320(5). In this case, contact surface 318 and contact surface 320(5) define a free range of rotation $RoR_5$ for the friction clip 314(5) that equals a width of the friction clip. Stated another way, friction clip 314(5) is captured between contact surface 318 and contact surface 320(5) and has an effective free range of rotation of zero. Thus, friction clip 314(5) always provides resistance to rotation in either direction (e.g., clockwise or counter-clockwise). As such, friction clip 314(5) can provide continuous resistance to rotation for device applications where a minimum amount of resistance to rotation is desired. The remaining friction clips 314(1)-314(4) function similar to those described above and increase resistance to rotation depending on the orientation of the first portion arm 302 and the second portion arm 304 and the direction of rotation.

Figure 5A:
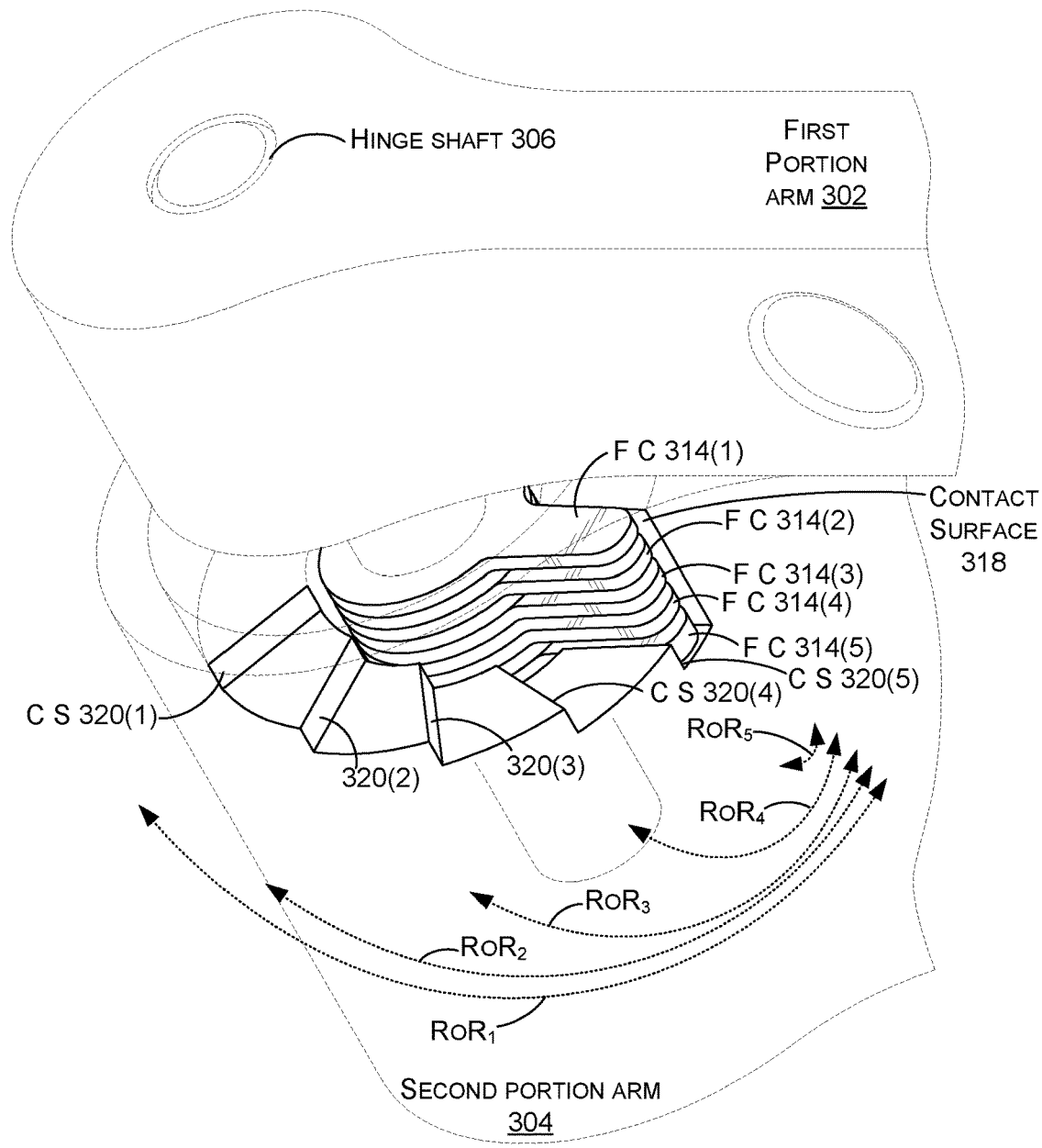
Figure 5B:
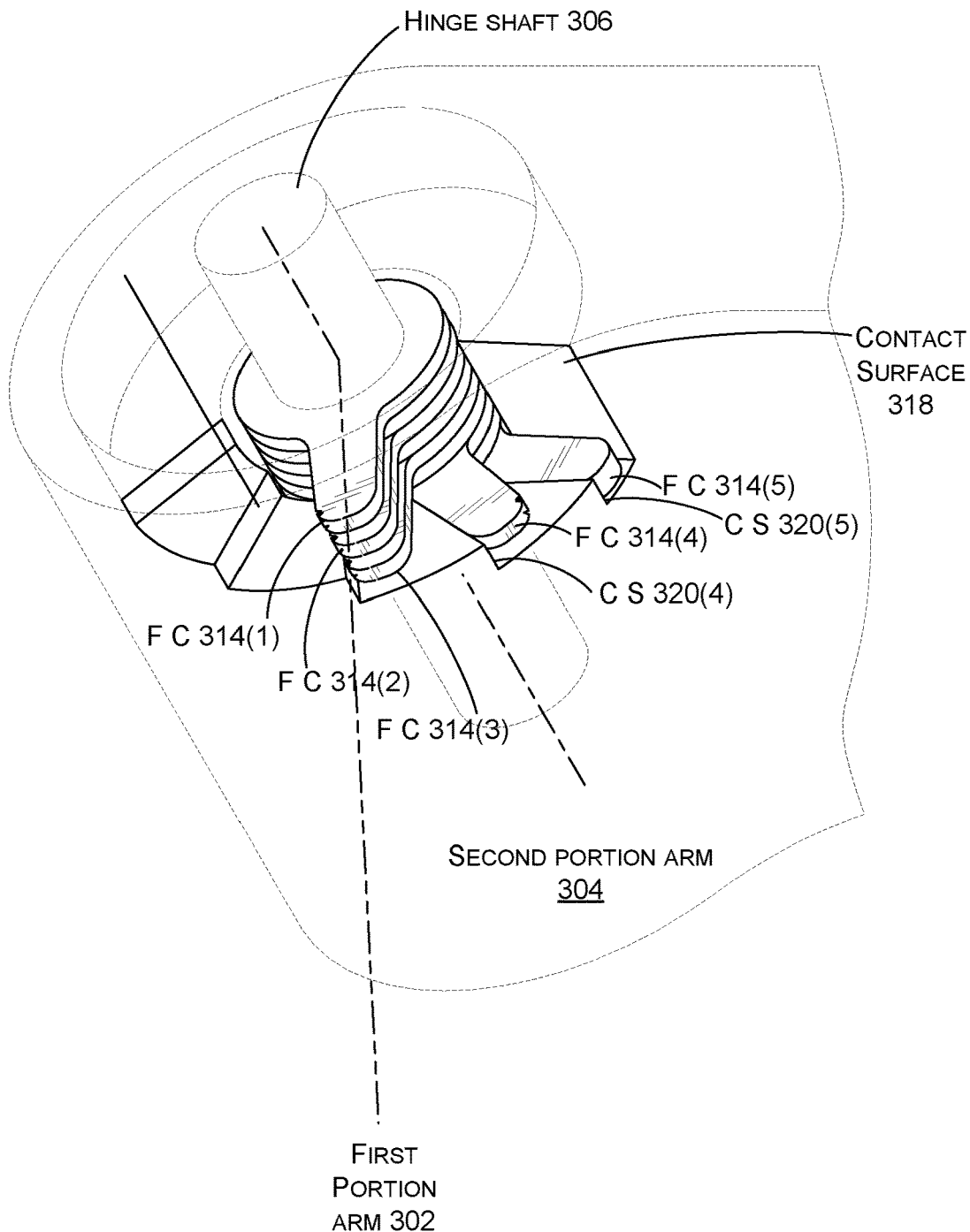

Starting at FIG. 5A, and beginning to rotate in the clockwise direction, only friction clip 314(5) provides resistance to rotation. FIG. 5B shows the variable resistance hinge assembly 106D after about 60 degrees of clockwise rotation. At this point, friction clips 314(5), 314(4), and 314(3) are providing resistance to rotation while friction clips 314(2) and 314(1) are rotating freely.

Figure 5C:
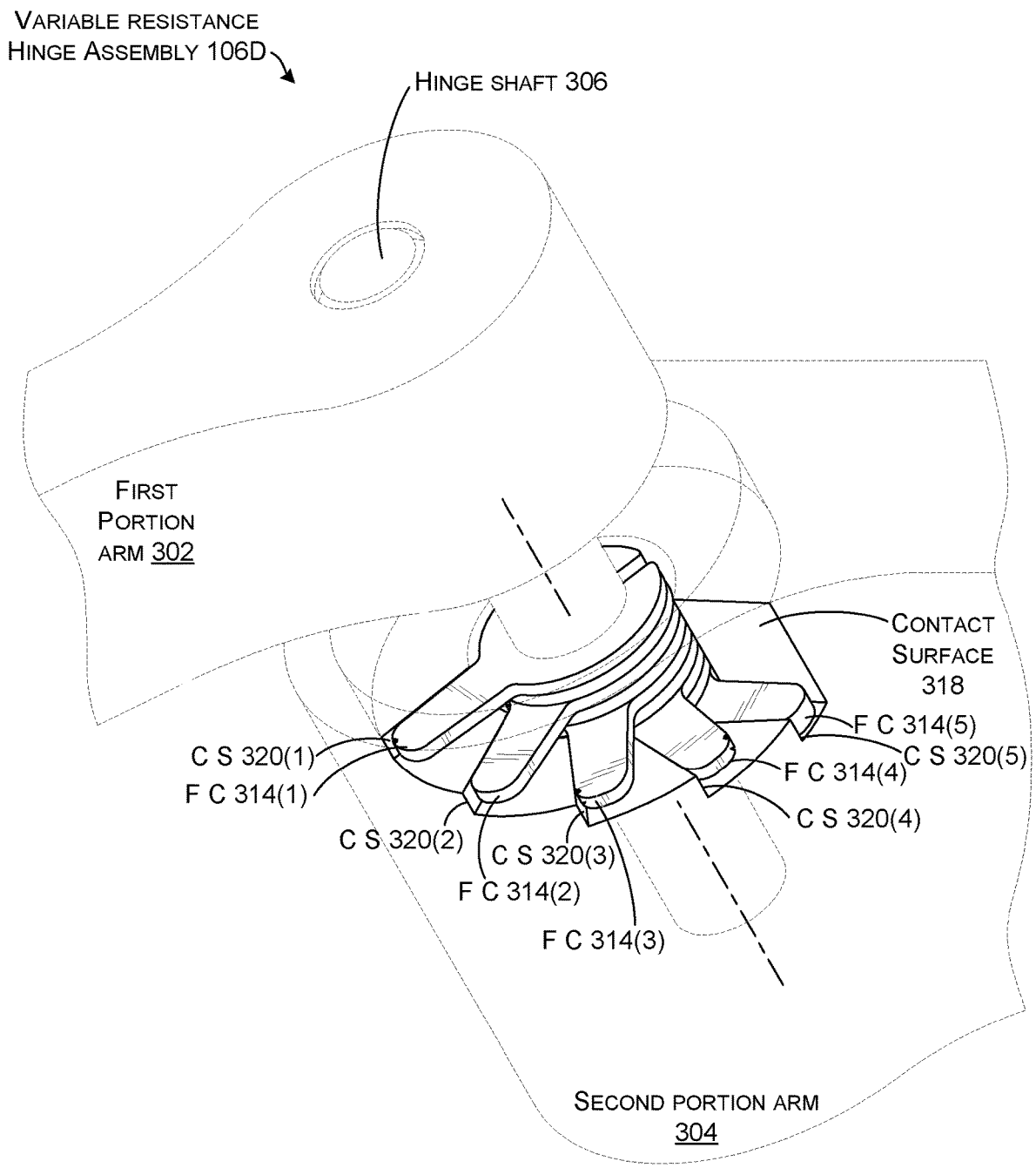
Figure 5D:
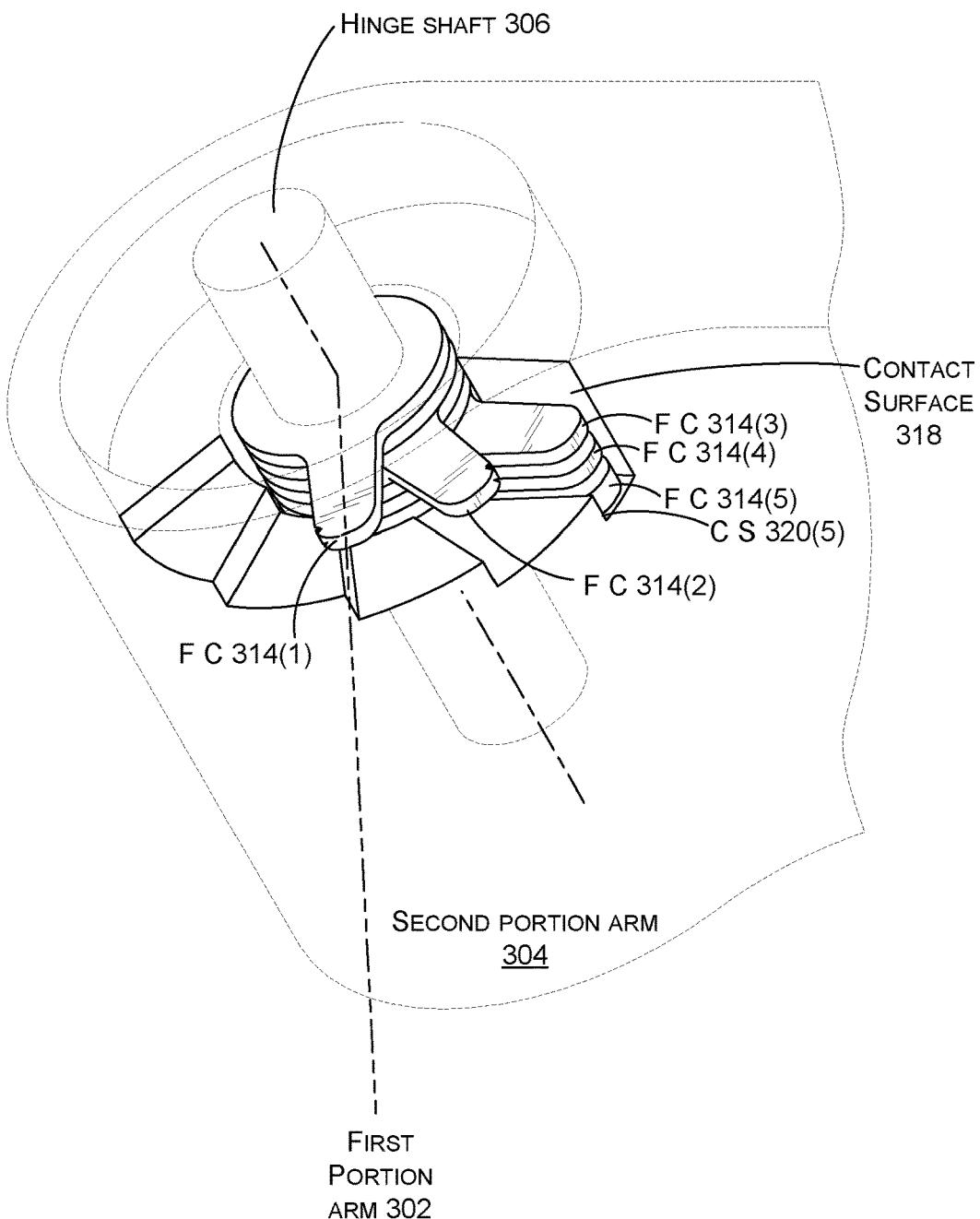

FIG. 5C shows the variable resistance hinge assembly 106D after about another 60 degrees of clockwise rotation. At this point, all of the friction clips 314(5)-314(1) are providing resistance to further rotation in the clockwise direction. FIG. 5D shows the variable resistance hinge assembly 106D after about 60 degrees of counter-clockwise rotation. At this point, friction clips 314(5), 314(4), and 314(3) are providing resistance to further rotation while friction clips 314(2) and 314(1) are rotating freely with the hinge shaft 306.

In the implementations described above, the contact surfaces 320 are manifest as a set of vertical surfaces with interposed horizontal surfaces. These implementations can be viewed as representing a spiral staircase or stepped surfaces defining a portion of a helix. Other configurations are contemplated. One such configuration is described below relative to FIGS. 6A and 6B.

Figure 6A:
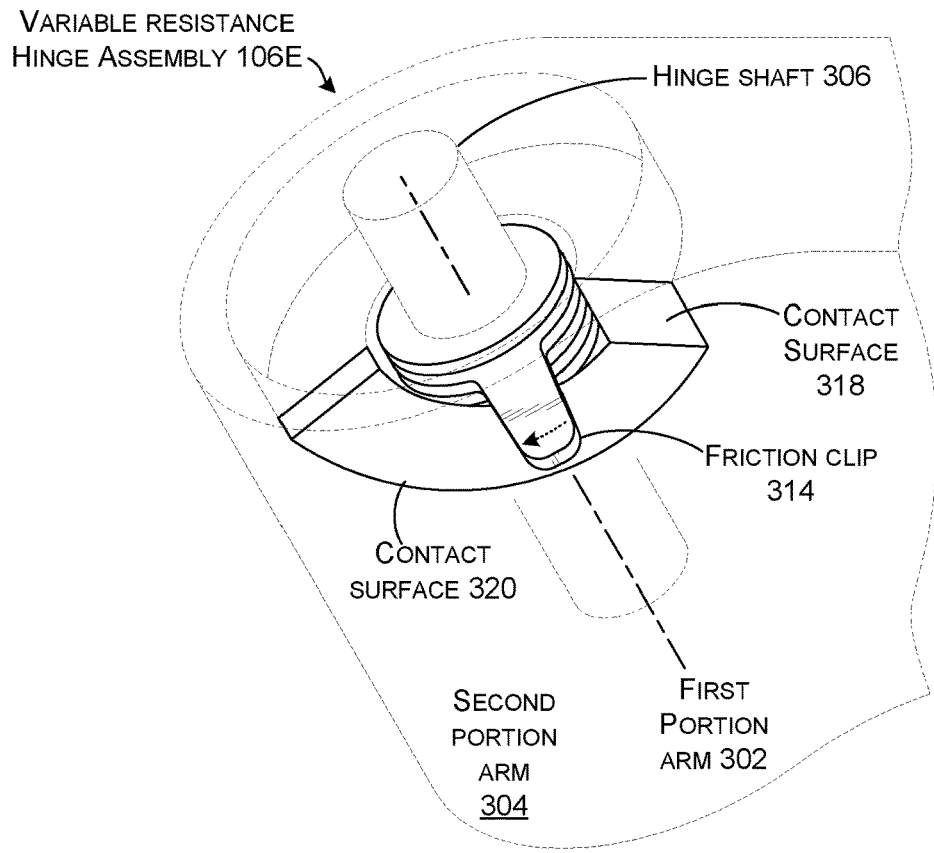
Figure 6B:
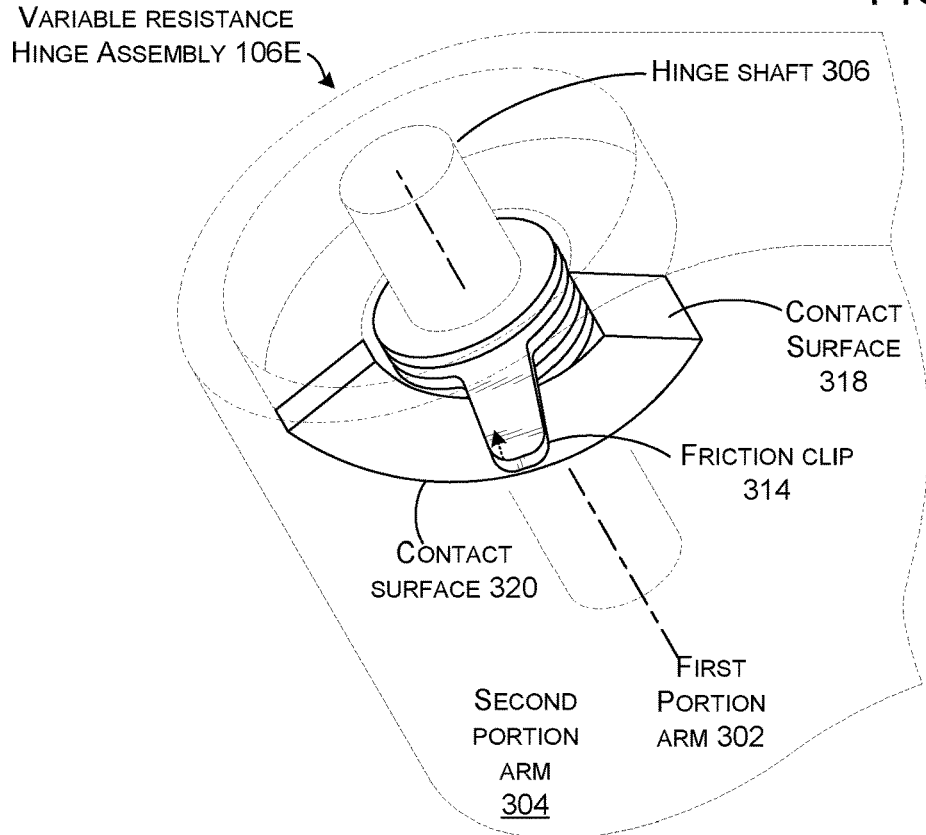

FIGS. 6A and 6B collectively show another example variable resistance hinge assembly 106E. In this case, contact surface 320 is manifest as a single curved helical contact surface. A free range of rotation of an individual friction clip 314 is defined by contact surface 318 and a point on contact surface 320 at an elevation of the friction clip when the friction clip rotates with the hinge shaft 306. Note that for sake of brevity, only a single friction clip is illustrated, but any number of friction clips can be employed.

In some implementations, the friction clip 314 may gradually create resistance to rotation. For instance, FIG. 6A shows the friction clip rotating clockwise with the hinge shaft 306 and just beginning to contact the contact surface 320. The friction clip may flex slightly and ride up the contact surface a short distance before rotation stops as shown in FIG. 6B. The gradual stop can gradually increase the resistance to rotation imparted by the friction clip 314 on the hinge shaft 306.

Figure 7C:
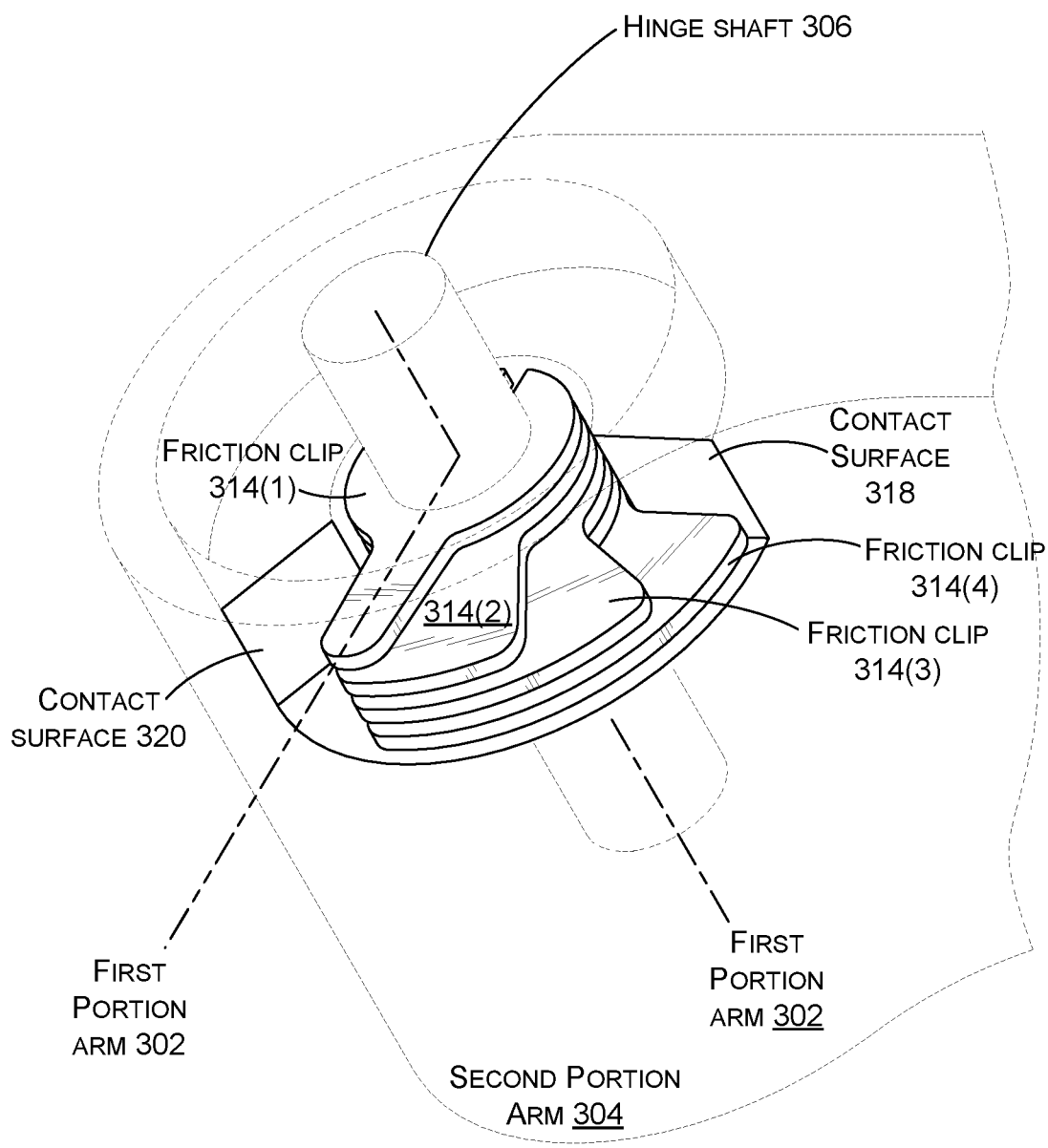

FIG. 7A-7D collectively show another example variable resistance hinge assembly 106F. In this case, contact surfaces 318 and 320 are manifest as parallel vertical surfaces (e.g., they are parallel to one another and to the hinge axis). In this configuration, as can be seen in FIG. 7B, the width W of individual friction clips 314 can vary relative to other friction clips 314. In this case, friction clip 314(1) has the narrowest width $W_1$, friction clip 314(2) has the next larger width $W_2$, friction clip 314(3) has the next larger width $W_3$, and friction clip 314(4) has the widest width $W_4$. While linear width is used here, the dimensions could alternatively be expressed relative to angles subtended by individual friction clips 314.

FIG. 7A shows the friction clips 314 all rotated against contact surface 320 in the 'fully open' orientation. At this point, each of the friction clips 314 is providing resistance to further rotation of the hinge shaft 306 in the clockwise direction.

FIG. 7C show the hinge shaft 306 and friction clips 314 rotated in the counter-clockwise direction by about 25 degrees relative to FIG. 7A. During this rotation, the friction clips 314 were free to rotate and did not contribute to resistance to rotation for the hinge shaft 306. At this point, friction clip 314(4) is just contacting contact surface 318 and will now provide resistance to further rotation of the hinge shaft 306 in the counter-clockwise direction. Friction clips 314(1)-314(3) remain free to rotate and are not contributing significant resistance to rotation.

Figure 7D:
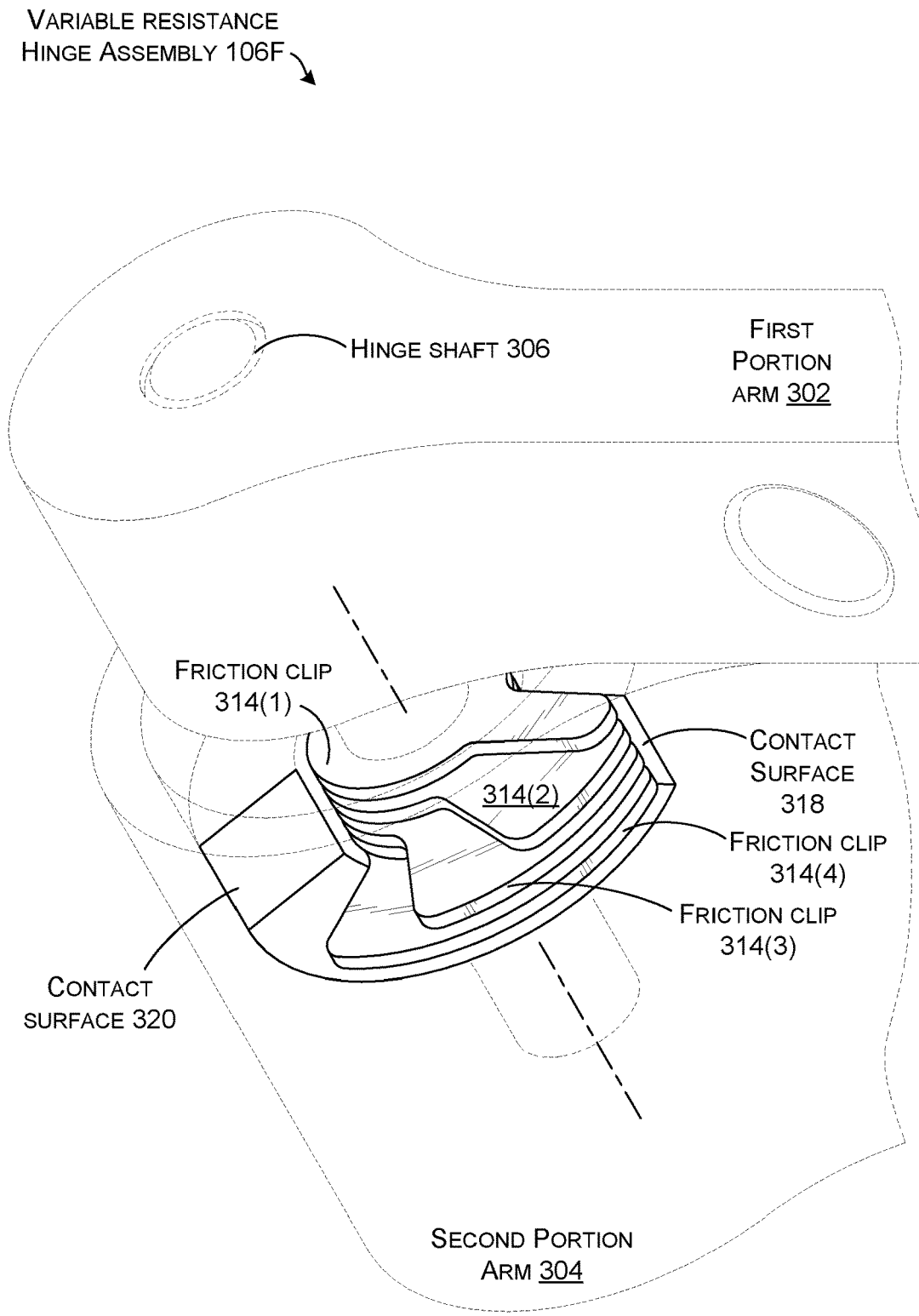

FIG. 7D shows the variable resistance hinge assembly 106F after about another 70 degrees of counter-clockwise rotation relative to FIG. 7C. At this point, all of the friction clips 314 are contacting contact surfaces 318 and will contribute resistance to rotation to any further rotation of the hinge shaft 306 in the counter-clockwise direction. Thus, in these implementations, the differing widths of the friction clips 314 causes them to encounter the contact surfaces 318 and 320 at differing points in the overall range of rotation of the first and second portions. The resistance to rotation is determined at least in part, by the point in the rotation and which fiction clips are blocked from further rotation and which are rotating freely.

Multiple example implementations of variable resistance hinge assemblies 106 are described above where a combination of friction clips 314 and contact surfaces 318 and 320 collectively create variable resistance to rotation over a range of rotation in one direction and another variable resistance to rotation over the range of rotation in the opposite direction. Other manifestations of various components are contemplated for achieving these concepts.

Individual elements of the variable resistance hinge assemblies can be made from various materials, such as metals, plastics, and/or composites. These materials can be prepared in various ways, such as in the form of sheet metals, die cast metals, machined metals, 3D printed materials, molded or 3D printed plastics, and/or molded or 3D printed composites, among others, and/or any combination of these materials and/or preparations can be employed.

The present hinge assembly concepts can be utilized with any type of device, such as but not limited to notebook computers, smart phones, wearable smart devices, tablets, vehicles, and/or other types of existing, developing, and/or yet to be developed devices.

Various methods of manufacture, assembly, and/or use for variable resistance hinge assemblies and devices are contemplated beyond those shown above relative to FIGS. 1A-7D.

Various examples are described above. Additional examples are described below. One example includes a device comprising first and second portions that rotate around a hinge shaft that is fixedly secured to the first portion and rotationally secured to the second portion, the second portion defining a first contact surface spaced apart from a second contact surface, and multiple friction clips friction fit around the hinge shaft and rotating with the hinge shaft between the first contact surface and the second contact surface, individual friction clips having different free ranges of rotation as defined at least in part by the first contact surface and the second contact surface.

Another example can include any of the above and/or below examples where the multiple friction clips have equal widths to one another.

Another example can include any of the above and/or below examples where the multiple friction clips have differing widths from one another.

Another example can include any of the above and/or below examples where the differing widths are ordered from widest to narrowest.

Another example can include any of the above and/or below examples where the first and second contact surfaces are parallel to one another and to the hinge shaft.

Another example can include any of the above and/or below examples where the first contact surface is parallel to the hinge shaft and the second contact surface comprises a portion of a helix that extends around the hinge shaft.

Another example can include any of the above and/or below examples where the second contact surface comprises a single continuous surface.

Another example can include any of the above and/or below examples where the second contact surface comprises a sequence of stair steps.

Another example can include any of the above and/or below examples where the first contact surface and the second contact surface collectively define a unique free range of rotation for each individual friction clip.

Another example can include any of the above and/or below examples where the first contact surface and the second contact surface define a range of free rotation for each friction clip.

Another example can include any of the above and/or below examples where rotation of the hinge shaft beyond the free range of rotation of an individual friction clip causes slippage between the hinge shaft and the individual friction clip.

Another example can include any of the above and/or below examples where individual adjacent friction clips are separated by a spacer or wherein individual adjacent friction clips contact one another.

Another example includes a device comprising first and second portions that rotate around a hinge shaft, opposing first and second contact surfaces defined by the first portion and/or the second portion, and multiple friction clips that are friction fit around the hinge shaft, individual friction clips are free to rotate with the hinge shaft in a free range of rotation defined between the first contact surface and the second contact surface and cause resistance to further rotation when contacting either of the first and second contact surfaces.

Another example can include any of the above and/or below examples where the first contact surface and the second contact surface define a different free range of rotation for each individual friction clip.

Another example can include any of the above and/or below examples where the individual friction clips do not initially cause any resistance to rotation when a direction of rotation of the hinge shaft is reversed.

Another example can include any of the above and/or below examples where a first individual friction clip is captured between the first contact surface and the second contact surface and has a free range of rotation of zero degrees.

Another example includes a device comprising first and second portions and a variable resistance hinge assembly that rotationally secures the first and second portions, the variable resistance hinge assembly providing increasing resistance as rotation of the first and second portions continues in a given direction and when rotation switches to an opposite direction, the variable resistance hinge assembly providing a lesser resistance that once again increases as rotation continues in the opposite direction.

Another example can include any of the above and/or below examples where the lesser resistance is zero resistance.

Another example can include any of the above and/or below examples where the increase in resistance occurs in even increments along a range of rotation of the first and second portions.

Another example can include any of the above and/or below examples where the increase in resistance is concentrated toward an end of a range of rotation of the first and second portions.

Although techniques, methods, devices, systems, etc., pertaining to variable resistance hinge assemblies are described in language specific to structural features and/or methodological acts, it is to be understood that the subject matter defined in the appended claims is not limited to the specific features or acts described. Rather, the specific features and acts are disclosed as example forms of implementing the claimed methods, devices, systems, etc.

The invention claimed is:

1. A device, comprising:
    first and second portions that rotate around a hinge shaft that is fixedly secured to the first portion and rotationally secured to the second portion;
    the second portion defining a first contact surface spaced apart from a second contact surface; and,
    multiple friction clips friction fit around the hinge shaft and rotating with the hinge shaft between the first contact surface and the second contact surface, individual friction clips having different free ranges of rotation as defined at least in part by the first contact surface and the second contact surface, the multiple friction clips having differing widths from one another as measured in a direction perpendicular to the first contact surface.

2. The device of claim 1, wherein the differing widths are ordered from widest to narrowest.

3. The device of claim 1, wherein the first and second contact surfaces are parallel to one another and to the hinge shaft.

4. The device of claim 1, wherein the first contact surface and the second contact surface define a free range of rotation of zero degrees for one individual friction clip.

5. The device of claim 1, wherein rotation of the hinge shaft beyond the free range of rotation of an individual friction clip causes slippage between the hinge shaft and the individual friction clip.

6. The device of claim 1, wherein individual adjacent friction clips are separated by a spacer or wherein individual adjacent friction clips contact one another.

7. A device, comprising:
    first and second portions that rotate around a hinge shaft;
    opposing first and second contact surfaces defined by the first portion and/or the second portion; and,
    multiple friction clips that are friction fit around the hinge shaft, individual friction clips are free to rotate with the hinge shaft in a free range of rotation defined between the first contact surface and the second contact surface and cause resistance to further rotation when contacting either of the first and second contact surfaces, and two of the multiple friction clips have different free ranges of rotation from one another.

8. A device, comprising:
    first and second portions that rotate around a hinge shaft that is fixedly secured to the first portion and rotationally secured to the second portion;
    the second portion defining a first contact surface spaced apart from a second contact surface and the second contact surface comprises a sequence of stair steps; and,
    multiple friction clips friction fit around the hinge shaft and rotating with the hinge shaft between the first contact surface and the second contact surface, individual friction clips having different free ranges of rotation as defined at least in part by the first contact surface and the sequence of stair steps of the second contact surface.

\* \* \* \* \*